US012785635B2

(12) United States Patent
Novello et al.

(10) Patent No.: US 12,785,635 B2
(45) Date of Patent: Nov. 3, 2026

(54) ELECTRICAL CONVERTER AND METHOD FOR OPERATING AN ELECTRICAL CONVERTER

(71) Applicant: ETH Zürich, Zürich ETH Zentrum (CH)

(72) Inventors: Alessandro Novello, Zürich (CH); Gabriele Atzeni, Zürich (CH); Jang Taekwang, Zürich (CH)

(73) Assignee: ETH Zürich, Zürich ETH Zentrum (CH)

( * ) Notice: Subject to any disclaimer, the term of this patent is extended or adjusted under 35 U.S.C. 154(b) by 517 days.

(21) Appl. No.: 18/263,140

(22) PCT Filed: Feb. 3, 2022

(86) PCT No.: PCT/EP2022/052539
§ 371 (c)(1),
(2) Date: Jul. 27, 2023

(87) PCT Pub. No.: WO2022/167507
PCT Pub. Date: Aug. 11, 2022

(65) Prior Publication Data

US 2024/0171138 A1 May 23, 2024

(30) Foreign Application Priority Data

Feb. 4, 2021 (CH) .................................... 00109/21

(51) Int. Cl.
*H03F 3/217* (2006.01)
*H02M 3/338* (2006.01)

(52) U.S. Cl.
CPC .......... *H03F 3/2178* (2013.01); *H02M 3/338* (2013.01)

(58) Field of Classification Search
CPC .................................................... H03F 3/2178
(Continued)

(56) References Cited

U.S. PATENT DOCUMENTS 6,166,921 A 12/2000 Rudelle
8,198,945 B2 * 6/2012 Sanduleanu ........... H03B 27/00
331/46
(Continued)

FOREIGN PATENT DOCUMENTS

EP 3291446 A1 3/2018
EP 3512087 A1 7/2019
(Continued)

OTHER PUBLICATIONS

Spina, Current-Reuse Transformer-Coupled Oscillators, IEEE Transactions on Circuits, Dec. 2015, p. 2940.
(Continued)

*Primary Examiner* — Joseph Chang
(74) *Attorney, Agent, or Firm* — Oppedahl Patent Law Firm LLC

(57) ABSTRACT

A DC-DC converter topology based on electromagnetically coupled class-D LC oscillator is proposed. An electrical converter comprises at least two oscillators (1,2), each of the at least two oscillators being designed to have an oscillating current and an oscillating voltage. Coupling elements (16, 17, 18, 19) arranged to couple the oscillating currents of the at least two oscillators and/or the oscillating voltages of the at least two oscillator. The at least two oscillators are connected in a series connection, adding their oscillating voltages, and/or in a parallel connection, adding their oscillating currents. The topology can be fully integrated, that is, it can be realized as an integrated circuit without external components, in particular without external passive components, such as capacitors and/or inductors.

19 Claims, 21 Drawing Sheets

(58) Field of Classification Search
USPC .......................................................... 331/46
See application file for complete search history.

(56) References Cited

U.S. PATENT DOCUMENTS

| | | | | |
|---|---|---|---|---|
| 9,979,284 | B2 | 5/2018 | Jung | |
| 2005/0242795 | A1 | 11/2005 | Al-Kuran | |
| 2006/0087302 | A1 | 4/2006 | Scheinberg | |
| 2006/0120115 | A1 | 6/2006 | Chen | |
| 2009/0184754 | A1 | 7/2009 | Chen | |
| 2010/0052630 | A1 | 3/2010 | Chen | |
| 2011/0057732 | A1 * | 3/2011 | Taylor | H03L 5/00 331/46 |
| 2014/0043010 | A1 | 2/2014 | Salem | |
| 2014/0292419 | A1 | 10/2014 | Ragonese | |
| 2015/0180528 | A1 | 6/2015 | Ragonese | |
| 2016/0344287 | A1 | 11/2016 | Stauth | |
| 2017/0358993 | A1 | 12/2017 | Ragonese | |
| 2020/0036284 | A1 | 1/2020 | Qin | |

FOREIGN PATENT DOCUMENTS

| | | | |
|---|---|---|---|
| JP | 2021136793 | A | 9/2021 |
| WO | WO2014120002 | A1 | 8/2014 |
| WO | WO2015120131 | A1 | 8/2015 |
| WO | WO2015120306 | A2 | 8/2015 |

OTHER PUBLICATIONS

Tabrizi, Fully Integrated 98mV Start Up DC-DC Converter, p. 264, 10th Intl Conference on Electrical, IEEE Xplore, Nov. 30, 2017.
Turnquist, A Fully Integrated Self-Oscillating Switched-Capacitor DC-DC Converter, IEEE Asian Solid-State Circuits Conference, Nov. 9, 2015, p. 12-1.
Jung, A 3nW Fully Integrated Energy Harvester Based on Self-Oscillating Switched-Capacitor DC-DC Converter, ISSCC 2014, Session 23, Energy Harvesting, Feb. 12, 2014.
Greco Nunzio et al, "A Galvanically Isolated DC-DC Converter Based on Current-Reuse Hybrid-Coupled Oscillators", Jan. 2, 2017, vol. 64, No. 1, p. 56-60.
Greco, "Integrated transformer modelling for galvanically isolated power transfer sys", 2017 13th Conf on Ph.D. Res. in Microelectronics (Prime), IEEE, Jun. 12, 2017, p. 325-328.
Tang, "A fully integrated 28nm CMOS dual source adaptive thermoelectric and RF energy harvesting circuit with 110mv startup voltage", 2018 IEEE CICC, Apr. 8, 2018, p. 1-4.
Li, "19.6 A 0.2V trifilar-coil DCO with DC-DC converter in 16nm FinFET CMOS with 188dB FOM, 1.3kHz resolution", 2017 IEEE ISSCC (Feb. 5, 2017), p. 332-333.
Spina Nunzio et al, "Current-Reuse Transformer-Coupled Oscillators With Output Power Combining for Galvanically Isolated Power Transfer Systems", May 2, 2015, vol. 62, No. 12.
International Search Report in PCT/EP2022/052539, mailed May 20, 2022.
Written Opinion in PCT/EP2022/052539, completed May 9, 2022.

* cited by examiner

ELECTRICAL CONVERTER AND METHOD FOR OPERATING AN ELECTRICAL CONVERTER

The current invention relates to the field of power converters, and particularly to an electrical converter and method for operating an electrical converter.

Direct-current to direct-current DC-DC converters are implemented in a vast variety of electronic devices to shape the power supplied by a source, which could be a battery for instance, to a load which will make use of such power, requiring a defined amount of power at determined current and voltage values that the converter needs to be able to provide. Furthermore, those values change over time depending on the activity of the load consuming the power, thus the converter has to guarantee a regulated amount of the delivered power, current and voltage values.

Conventional converter topologies such as buck and boost are widely used, making use of a switching stage and a LC filter to provide a regulated output voltage. Switched Capacitor (SC) converters make use of a network of capacitors to convert an input voltage to a desired output voltage level. Hybrid-resonant SC topologies make use of an inductor to hybridize a flying impedance, which would be just a capacitor in a conventional SC implementation, to improve the power density and reduce the switching losses by operating at lower frequencies. Hybrid converters combine the benefits of SC and inductive topologies to decrease the stress on the power devices by down-converting the high input voltage with an SC network and using an output inductor to provide current to the load for high efficiency.

U.S. Pat. No. 9,979,284 B2 discloses a self-oscillating DC-DC converter structure in which an oscillator is completely internalized within the switched-capacitor network, eliminating the need for clock generation.

US 2016/0344287 A1 discloses controlling a resonant switched-mode converter to provide a variable conversion ratio. Switches are controlled to set the impedance of the converter to different configurations during different time intervals.

US 2014/0043010 A1 shows a recursive DC-DC converter capable of operating at different voltage conversion ratios. It comprises a plurality of switched cells connected in cascade and/or in a stack.

It is therefore an object of the invention to create an improved electrical converter and method for operating an electrical converter of the type mentioned initially.

These objects are achieved by an electrical converter and a method for operating an electrical converter according to the corresponding independent claims.

The electrical converter comprises at least two oscillators, each of the at least two oscillators being designed to have an oscillating current and an oscillating voltage; one or more coupling elements arranged to couple at least one of the oscillating currents of the at least two oscillators, and the oscillating voltages of the at least two oscillators; the at least two oscillators being connected in a series connection, adding their oscillating voltages, or in a parallel connection, adding their oscillating currents, or in a combination of series and parallel connections.

The oscillating currents being coupled means that the currents oscillate synchronously. Likewise, the oscillating voltages being coupled means that the voltages oscillate synchronously.

A series connection shall also be called vertical arrangement of oscillators. A parallel connection shall also be called horizontal arrangement of oscillators.

In embodiments, the one or more coupling elements comprise inductive coupling elements, coupling oscillating currents of the at least two oscillators, in particular wherein one or more of the inductive coupling elements are transformers.

The inductive coupling can be positive or negative. In embodiments, the transformers are 1:1 transformers. In embodiments, they have a transformer ratio different from 1:1.

In embodiments, wherein the one or more coupling elements comprise capacitive coupling elements, coupling oscillating voltages of the at least two oscillators, in particular wherein one or more of the capacitive coupling elements are capacitors.

Such capacitors can be implemented as flying capacitors.

In embodiments, the at least two oscillators are self-oscillating oscillators.

The oscillators being self-oscillating means that the oscillator oscillates if a supply voltage is connected to the oscillator, without any external periodic signal being required to maintain the oscillation. In embodiments, the oscillators are negative gm oscillators.

In embodiments, at least one of the at least two oscillators is not a self-oscillating oscillator. This at least one not self-oscillating oscillator can be synchronised with a self-oscillating oscillator by coupling them, e.g. by capacitive coupling.

In embodiments, one or more of the at least two oscillators are configured to be switched on and off, enabling and disabling oscillation of the oscillator, respectively.

This allows to adapt operation of the converter to variations in load changes.

In embodiments, at least one, more than one, or all coupling elements are integrally manufactured with switches of the at least two oscillators.

That is, the coupling elements are implemented as part of an integrated circuit comprising the semiconductor switches of the oscillators, and also of switching units, if present. This can be the case for the coupling elements being inductive coupling elements and/or being capacitive coupling elements.

In embodiments, the converter is configured to have an oscillation frequency of the at least one oscillator to be at least 500 MHz, preferably at least 1 GHz.

Since the converter reduces switching losses, it can operate at such high frequencies. This in turn allows to implement some or all of the passive components, in particular the coupling elements, in an integrated fashion with the active components.

In embodiments, the converter is configured for continuous operation transferring power at a maximum rate of least 1 mW, in particular at least 10 mW, in particular at least 1 W.

Such power levels can be achieved thanks to the quasi-diabatic switching, which in turn is a result of shifting charges and/or currents by means of the coupling elements.

In embodiments, the converter is manufactured in a fully integrated fashion and configured to operate at a power density of least 0.1 $W/mm^2$, in particular at least 0.2 $W/mm^2$, in particular at least 0.5 $W/mm^2$, in particular at least 2.5 $W/mm^2$.

Fully integrated means that the entire converter, comprising all passive elements, including coupling elements, and active elements, is integrally manufactured as a single integrated circuit.

In embodiments, the converter in operation, manufactured in a fully integrated fashion, operates at an efficiency level of at least 50%, in particular at least 70%, in particular at least 80%.

In embodiments, the efficiency level lies between 50% and 70%, depending on the load, and the power density is at least 0.1 $W/mm^2$, in particular at least 0.2 $W/mm^2$, in particular at least 0.5 $W/mm^2$.

In embodiments, the efficiency level lies above 70%, depending on the load, and the power density is at least 0.01 $W/mm^2$, in particular at least 0.02 $W/mm^2$, in particular at least 0.05 $W/mm^2$.

The electrical converter presented herein can be implemented as an integrated circuit with a relatively small area thanks to the adiabatic switching method, which allows to increase the circuit frequency and reduce component size. By introducing resonance and coupling, charges can be moved away from parasitic gate capacitances. Otherwise, this would have to be done—as in the prior art—using additional switches to discharge the parasitic capacitances, leading to losses. Furthermore, having, in embodiments, identical waveforms in coupled oscillators results in in-phase, waveforms when adding signals from the oscillators, that is, when adding currents or voltages, as the case may be. Operation of the converter itself and of devices powered with such in-phase waveforms is more efficient than for phase-shifted signals.

The high speed provides a low output voltage ripple without any additional output capacitor, which otherwise is required in typical DC-DC converters.

Continuous power can be delivered to the output in 4 sub-phases, unlike discontinuous previous approaches Electromagnetic interference can be reduced because of the integrated transformer structure.

In summary, the proposed converter can be built by vertically stacking two or more class-D LC oscillators, which can be electrically coupled by means of the two flying capacitances $C_{fly,AB}$ and $C_{fly,CD}$, and magnetically coupled by the two on-chip integrated transformers $XFMR_{AB}$ and $XFMR_{CD}$. Furthermore, the bottom terminals of the two oscillators can be connected to a footer NMOS transistor controlled by an enable signal that can switch on and off the oscillation. The duty cycle of such an enable signal defines an on-time of the converter, which thereby can adapt the output power to the amount required by the load. In each oscillator, the cross-coupled pair operates as a negative gm cell, sustaining the resonant operation of the two oscillators when a DC input is provided.

The result is a power converter based on electromagnetically coupled class-D LC oscillators that can be fully integrated, that is, it can be realized as an integrated circuit without external components, in particular without external passive components, such as capacitors and/or inductors. The power converter can implement quasi-adiabatic switching at both the gate and bottom plate capacitances, enabling GHz-range operating frequency for aggressive miniaturization of the on-chip passive components, such as capacitors and inductors. High frequency continuous power can be delivered to a load, and operation without any output decoupling capacitor can be achieved. The high frequency continuous power delivery mechanism introduced by this topology eliminates the need of the large load capacitor implemented in previous approaches. The converter can operate close to a peak efficiency from 70 uW up to 0.5 W thanks to the duty cycling scheme. High power densities on the order of 1 W/mm^2 can be achieved with this circuit topology.

Depending on the implementation, advantages of the power converter can be:

- GHz-range oscillating frequency, instead of MHz-range one of standard topologies
  - However, the oscillator could also work in the MHz with bigger inductor and/or capacitor (oscillating capacitor, not a flying one)
- Smaller size of the passive components (capacitor and inductor) enabled by the high switching frequency
  - However, it can also work with larger sizes of passive components.
- Full integration of the converter, which is hard and challenging in many fields, particularly power converters
  - Can be discrete (not fully integrated)
- High power density
  - Several W/mm^2, instead of mW/mm^2 of other topologies
    - Can be lower, in particular with bigger size passive components
- Full load operation without any load capacitor
  - Most of the current approaches require a load capacitor to contain the output voltage ripple, while in full load (therefore not in duty-cycled more where the oscillator is switched on and off). The power converter can do without one, and can generate, for example, a <20 mV ripple
- Elimination of auxiliary circuitry such as phase generators (if the structure is self-oscillating), level shifters and bootstrap (typically implemented in DC-DC converters to drive the power switches)

The subject matter of the invention will be explained in more detail in the following text with reference to exemplary embodiments which are illustrated in the attached drawings, in which.

Figure 1:
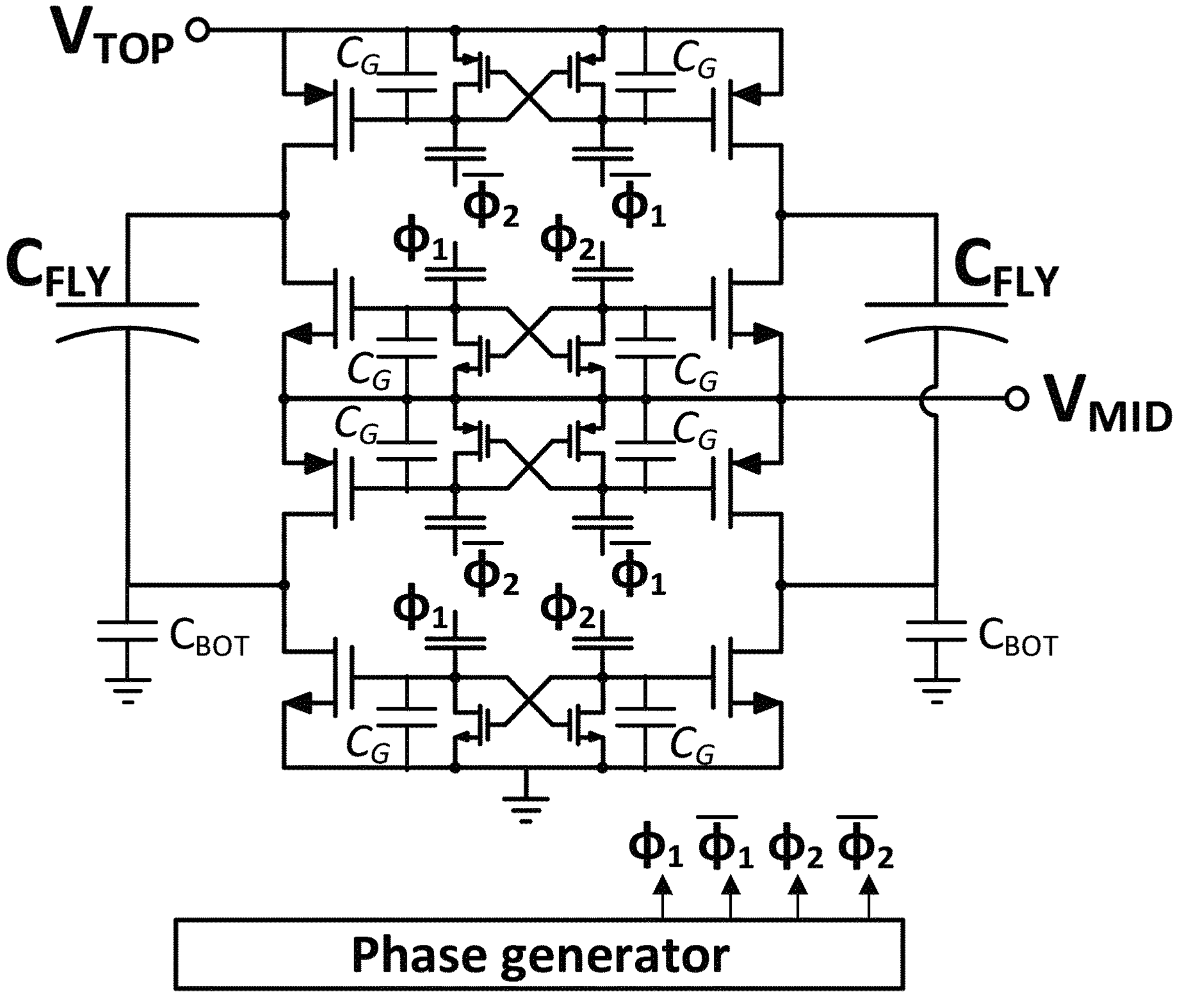
FIG. 1 (prior art)
FIG. 1 is a schematic of a prior art switched capacitor converter showing the basic structure and parasitic gate and bottom plate capacitances.
Figure 2:
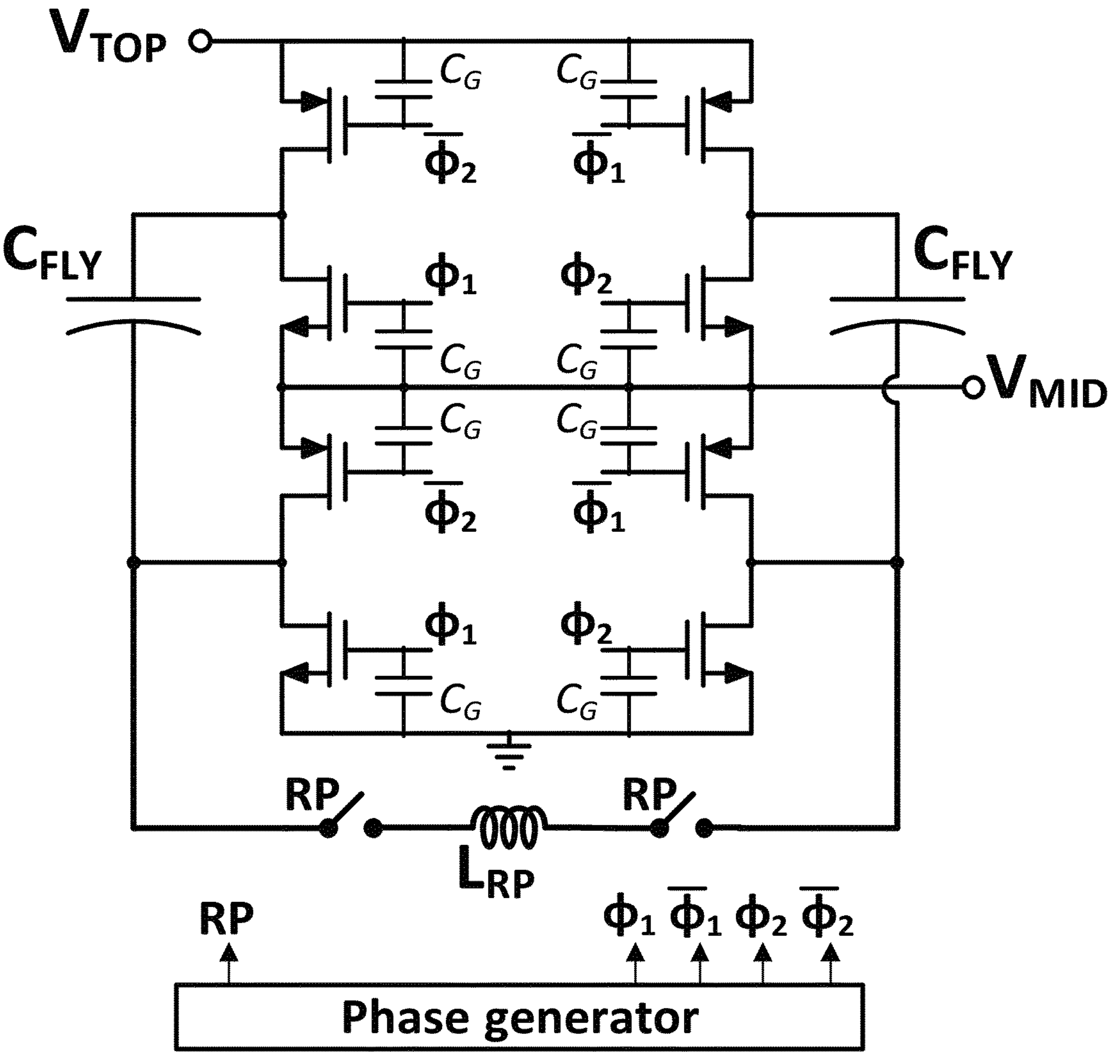
FIG. 2 (prior art)
FIG. 2 is a schematic of a prior art resonant-drain recycling switched capacitor circuit showing the basic structure (bottom plate and drain capacitances not shown, for the sake of clarity) and the parasitic gate capacitances.

With reference to FIG. 1, a conventional switched capacitor circuit is composed of a left and a right side, each one with four transistors and one flying capacitor. For down-converting operation the input voltage is applied at the VTOP node and the output voltage is generated on the VMID node. For the down-convert operation the input voltage is applied at the VMID node and the output voltage is generated on the VTOP node. The transistors are controlled with phase signals coming from a phase generator. One of the main loss mechanisms of such a topology are switching losses when turning on and off, caused by the parasitic capacitances at the bottom plate of the flying capacitors and at the gate of each transistor FIG. 2 shows a resonant-drain recycling circuit topology which partially reuses the energy that the previously mentioned parasitic bottom plate capacitances (for clarity, they are not shown in the figure) would lose. The structure is the same as that of a conventional switched capacitor circuit depicted in FIG. 1, but with an inductor $L_{RP}$ activated by two switches connected at its left-side and right-side terminals, controlled by a corresponding signal RP. If activated between two switched capacitor states, the inductor transfers the energy stored in one parasitic bottom plate capacitor to the one on the other side, recycling this energy and thereby improving the efficiency. However, the switching losses associated with the gate capacitances are still present.

Figure 3:
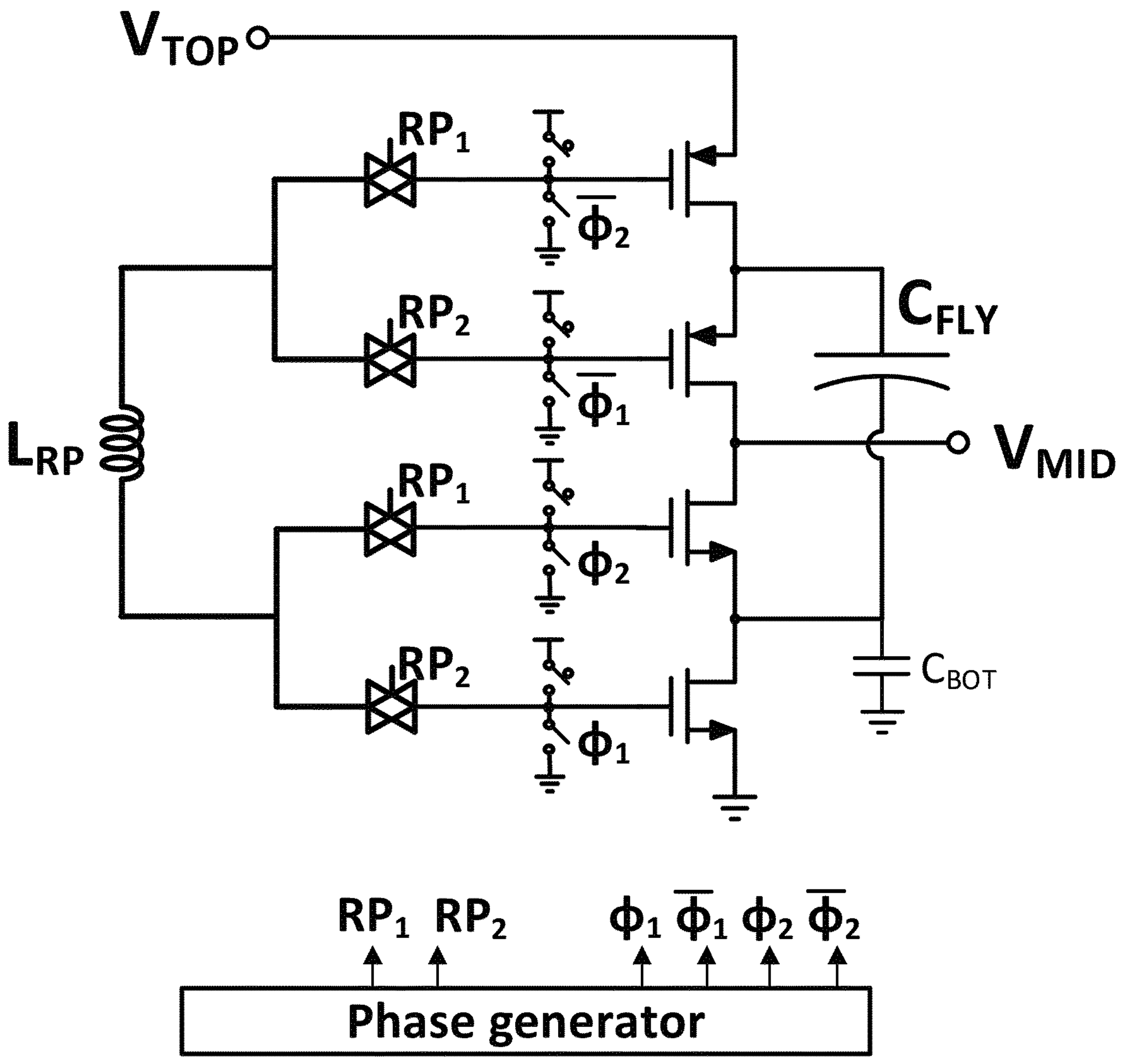
FIG. 3 (prior art)
FIG. 3 is a schematic of a prior art resonant-gate recycling switched capacitor circuit showing the basic structure and the parasitic bottom plate capacitance with the parasitic gate capacitances not shown, for the sake of clarity.

FIG. 3 depicts a resonant-gate recycling circuit topology which partially reuses the energy that the previously mentioned parasitic gate capacitances would lose (for clarity, they are not shown in the figure). The structure is the same to that of a conventional switched capacitor circuit depicted in FIG. 1, but with an inductor $L_{RP}$ activated by four switches connected at each transistor gate terminal, controlled by corresponding signals $RP_1$ and $RP_2$. If activated between two switched capacitor states, the inductor transfers the energy stored in one parasitic gate capacitor to the one which will be activated next, recycling this energy contribution improving the efficiency. However, the switching losses associated with the bottom plate capacitances are still present.

Figure 4:
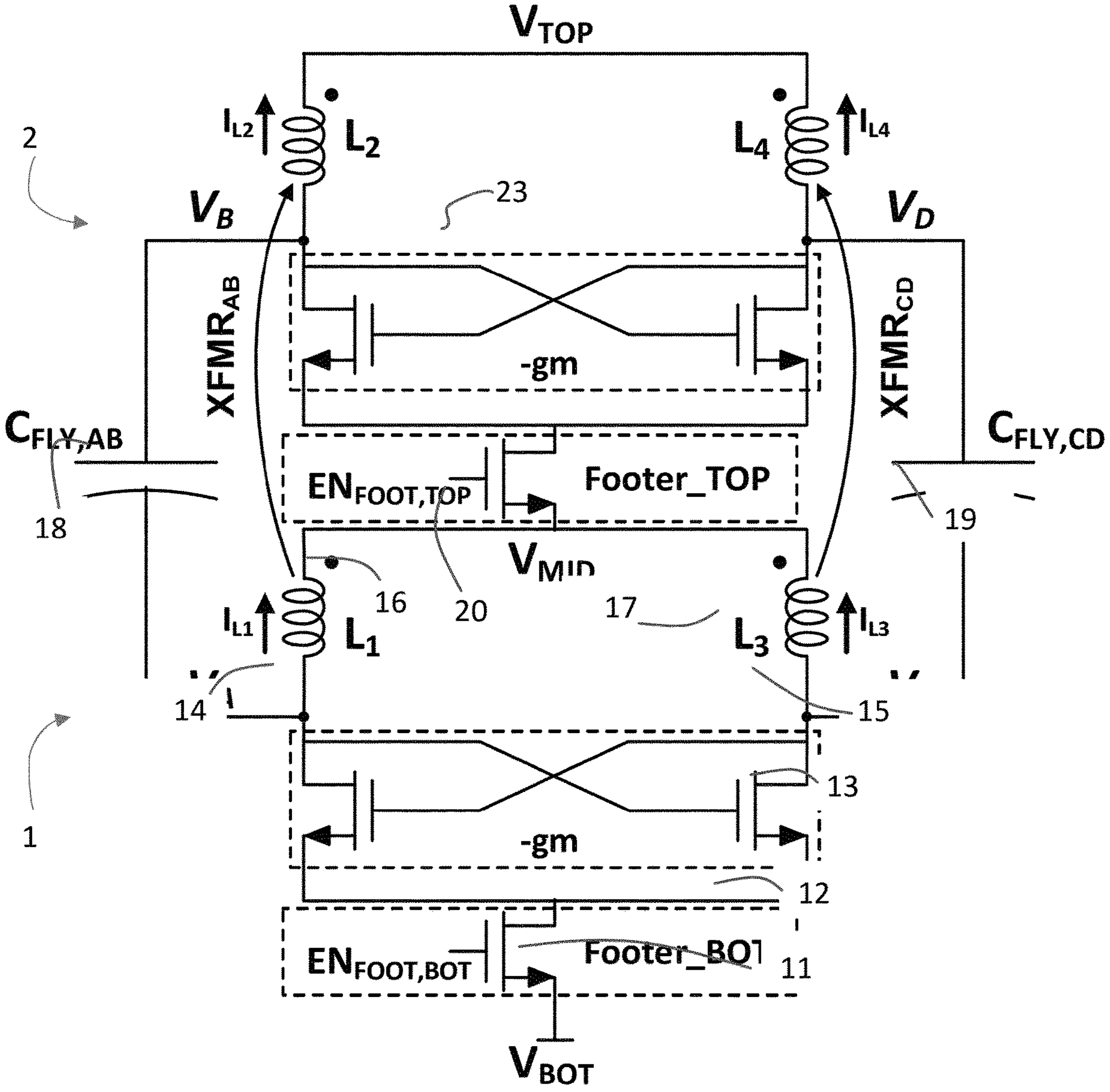
FIG. 4 is a schematic of the proposed converter showing the vertical stack of the two electromagnetically coupled class-D LC oscillators including footer transistors.

FIG. 4 shows an embodiment of the proposed circuit topology, comprising two vertically stacked class-D LC oscillators, a lower oscillator 1 and an upper oscillator 2 that are electrically and magnetically coupled by means of flying capacitors and transformers respectively.

The lower oscillator 1 comprises the following elements: a switching unit 12, an oscillator unit 13 and coupling elements 16, 17, 18, 19. The oscillator unit 13 comprises a lower terminal and two upper terminals 14, 15, corresponding to oscillating nodes. The oscillator unit 13 together with the inductors 16 and 17 together with the capacitance between the node 14 and ground as well as the capacitance between the node 15 and ground form the oscillator. The switching unit 12 is arranged to selectively connect or disconnect the lower terminal to a lower oscillator terminal 11. Each of the two upper terminals 14, 15 is connected through an associated inductance 16, 17 to an upper oscillator terminal 20. The upper oscillator 2 with an upper oscillator unit 23 has the same structure as the lower oscillator 1. The lower oscillator terminal of the upper oscillator 2 is connected to the upper oscillator terminal 20 of the lower oscillator 1.

In the embodiment of FIG. 4, the oscillator unit 13 is a negative gm cell unit.

The switching unit 12 can comprise a single switching element, also called footer transistor. The inductances of the two oscillators can be transformer windings, thereby coupling the inductances of the lower oscillator 1 with those of the upper oscillator 2, and serving as inductive coupling elements. The oscillating nodes of the upper and lower oscillator can be coupled pairwise by means of capacitors 18, 19, serving as capacitive coupling elements.

When operating the oscillators 1, 2, the lower oscillator terminal 11 can carry a lower voltage $V_{BOT}$, the lower oscillator terminal of the upper oscillator 2 and upper oscillator terminal 20 of the lower oscillator 1 can carry a voltage $V_{MID}$, and the upper oscillator terminal of the upper oscillator 2 can carry a voltage $V_{TOP}$.

The following detailed explanation involves the use of specific type of oscillator, but applies to other types as well.

Cross-coupled pairs of transistors in each of the oscillator units 13, 23 serve as negative gm cells for negative gm-based oscillators to sustain an oscillation when a DC voltage is applied at the common terminal between the two inductors. The footer transistors are controlled by an enable signal that can switch on and off the two oscillators, adapting the delivered power to the one required by the load.

A first flying capacitor $C_{fly,AB}$ is connected between the first oscillating node 14 with a voltage VA of the bottom oscillator 1 and the first resonating node with voltage VB of the top oscillator 2. A second flying capacitor $C_{fly,CD}$ is connected between the second oscillating node 15 with voltage $V_C$ of the bottom oscillator 1 and the second resonating node with voltage $V_D$ of the top oscillator. The flying capacitors $C_{fly,AB}$ and $C_{fly,CD}$—introduce an electric coupling between the bottom and top oscillator, as a consequence the alternating-current (AC) component of the top oscillator voltages $V_B$ and $V_D$ will follow the AC component of the bottom oscillator voltages $V_A$ and $V_C$.

The transformer $XFMR_{AB}$ implements a magnetic coupling between the inductors L1 and L2, and the transformer $XFMR_{CD}$ between the inductors L3 and L4. The magnetic coupling forces the AC component of the bottom and top oscillator currents to be identical.

To up-convert an input voltage, the DC source is connected on the top terminal of the bottom oscillator, which will start its operation. The resonating waveforms of the bottom oscillator are coupled to the top oscillator thanks to the electric and magnetic coupling offered by the flying capacitors and transformer respectively, with a DC shift equal to the input voltage. Thus, an output voltage on the top terminal of the top oscillator is generated which will be twice the input DC value.

To down-convert an input voltage, the DC source is connected on the top terminal of the top oscillator. Both oscillators will start to operate and a DC voltage of half magnitude with respect the input one will be generated on the top terminal of the bottom oscillator.

When the power required by the load strongly decreases, the converter might operate far from its peak efficiency point. In order to ensure high efficiency operation in light loads, a rectangular waveform is fed to both footer transistor gates defining the on-time of the converter. When the enable signal is at a high value, the converter operates as in full load and power is delivered to the load. When the enable signal is low, the oscillators are both switched off and no power is delivered to the load. Operation with efficiency close to the peak value is ensured it the duty cycle of the rectangular wave is tuned in a way to ensure the correct amount of power to the load.

By using the gate and drain parasitic capacitances of the transistors in the negative gm cells and the bottom plate parasitic capacitance of the flying capacitor as resonance element, together with one of the inductors of one of the transformers, the charge stored in the LC series resonant circuit is not discharged to ground as in the prior art, but is stored in the oscillator and then delivered to the output.

The value of inductances in the coupled oscillators can be different from one another, for generating different voltages across each oscillator. The capability of generating different voltages translates into different DC-DC converter voltage conversion ratios, expressed as VCR=VOUT/VIN, which makes the proposed topology more flexible to a wide variety of applications where there are specific demands on the voltage conversion ratio. So, in the context of FIG. 4 this can mean that L1 and L3 have a certain value and L2 and L4 have another value, different from that of L1 and L3.

Figure 5:
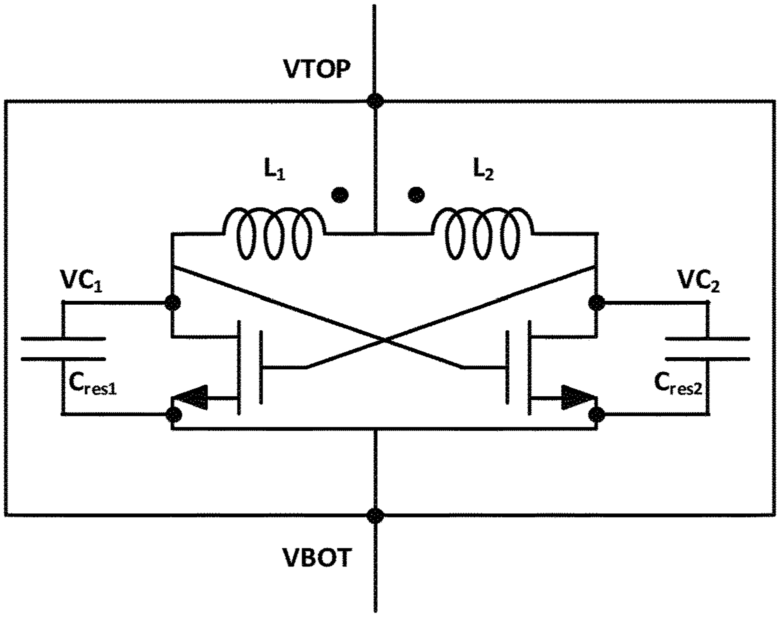
FIG. 5 is a schematic of a single class-D LC oscillator.

FIG. 5 shows the schematic of the single class-D LC oscillator, where the DC input voltage is connected at the $V_{TOP}$ terminal, the DC ground at the $V_{BOT}$ terminal and the two oscillating nodes are $VC_1$ and $VC_2$.

Where $L_1$ and $L_2$ are the two inductors and $C_{res1}$ and $C_{res2}$ are composed of the drain and gate parasitic capacitances of the transistors. When a DC voltage is applied on the $V_{TOP}$ terminal the oscillator starts its operation and two resonating voltages are generated on the nodes $VC_1$ and $VC_2$.

Figure 6:
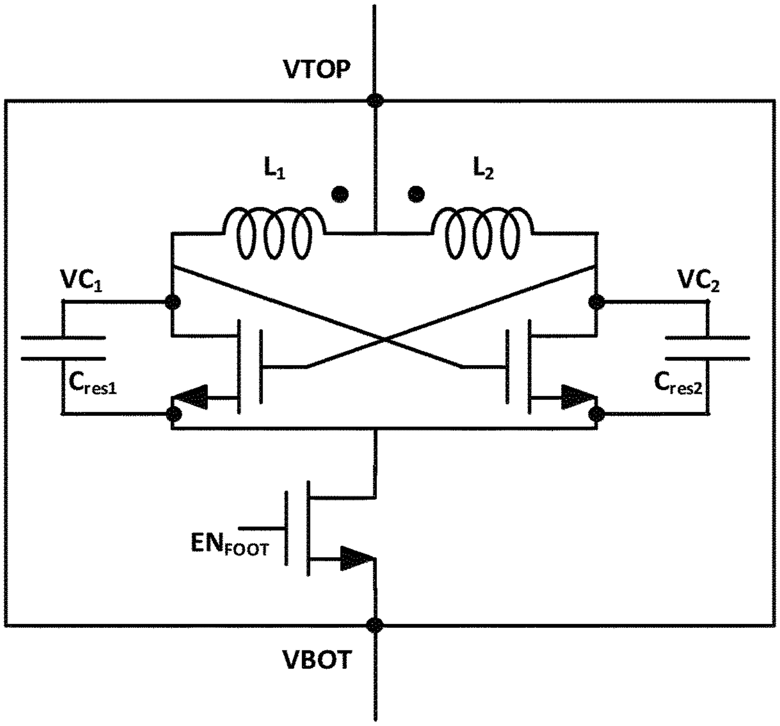
FIG. 6 is a schematic of the single class-D LC oscillator with a footer transistor connected on the bottom.

FIG. 6 shows the schematic of the single class-D LC oscillator with the footer transistor connected between the two transistor source terminals and the $V_{BOT}$ terminal. The footer transistor can stop the current flowing in the oscillator from the DC input connected at the $V_{TOP}$ terminal, stopping the oscillation as well. Therefore, the voltages $VC_1$ and $VC_2$ will not be resonating anymore and no current will be taken from the DC source. The oscillator will be totally shut down, consuming no power.

Figure 7:
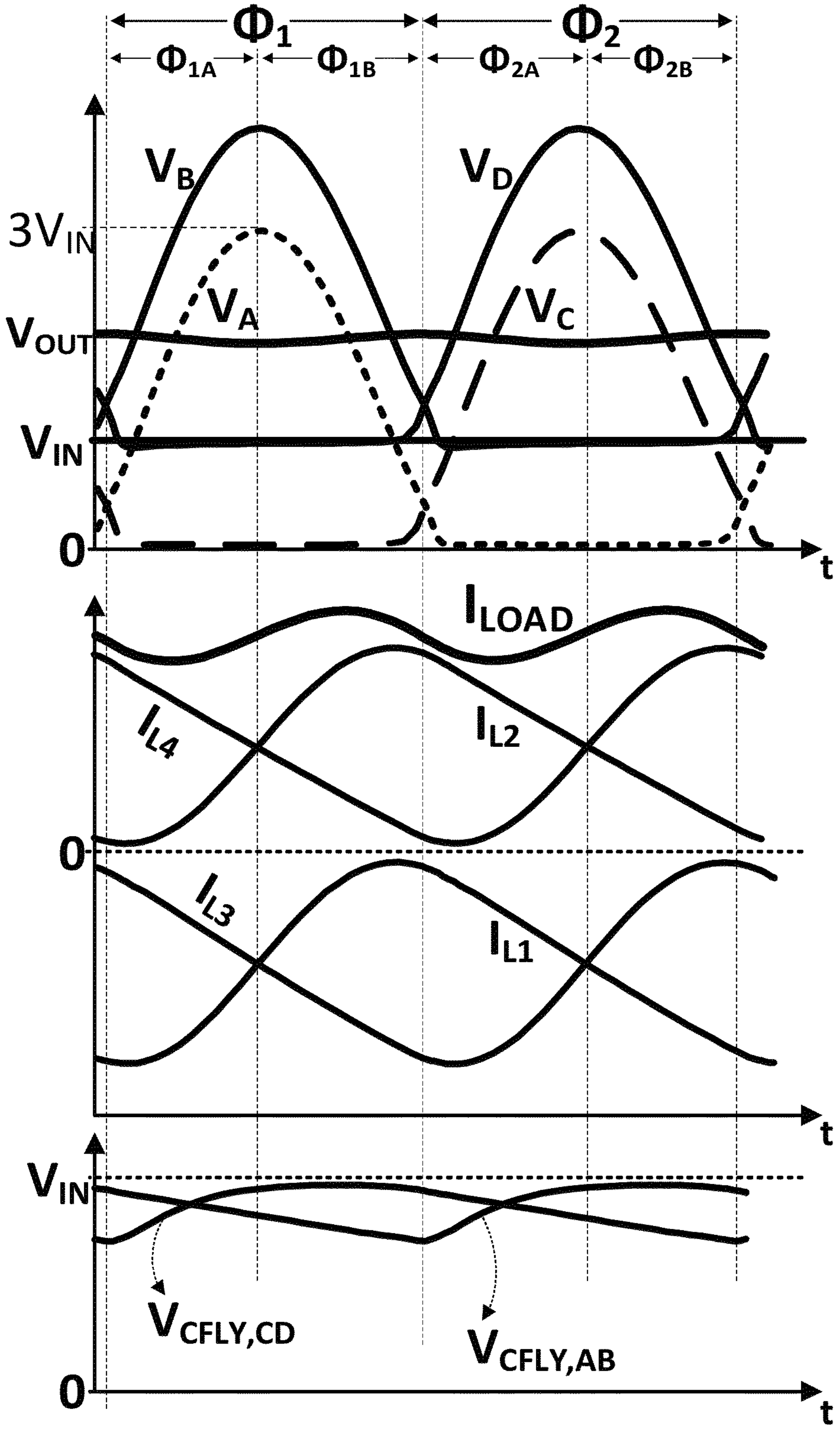
FIG. 7 depicts exemplary simulation results generated in a SPICE simulation for the converter in FIG. 4 when used as a voltage doubler, focusing on the full load operation.

FIG. 7 shows the result of the simulations in SPICE of the circuit depicted in FIG. 4 when operating as an up-converter. Thus, a DC input voltage is connected on the VMID terminal and the output voltage is generated on the VTOP terminal. The footer transistor is fed with a constant DC voltage and behave as a constantly-on ideal switch. The converter operates in two main phases ϕ1 and ϕ2, further divided in two sub-phases each, ϕ1A and ϕ113, ϕ2A and ϕ2B. The first graph on the top shows the resonating voltages. If operated as an up-converter connecting the DC source on the VMID terminal an taking the output voltage from the VTOP terminal, the electromagnetic coupling between the two stacked oscillators make the top one work reversely to the bottom one. Thus, the top oscillator voltages VB and VD will follow the bottom oscillator VA and VC, with a DC shift equal to the input voltage VIN. The output voltage VOUT will be generated on the VTOP terminal, and it will be equal to twice the input voltage if no load is applied. If a load is connected on the VTOP terminal the output voltage will be:

VOUT=2*VIN−ROUT*IOUT

Where Vin is the input voltage applied on the VTOP terminal, ROUT is the output resistance of the converter and IOUT is the output current of the converter leaving the VTOP terminal.

The second graph in FIG. 7 shows the inductor currents continuously oscillating throughout both phases, and the output current will be the sum of the inductor currents IL2 and IL4. The AC components of the top oscillator currents IL2 and IL4 follows the AC component of the bottom oscillator currents IL1 and IL3. The DC components of those currents goes farther from zero the higher the current required by the load.

The third graph in FIG. 7 depicts the flying capacitor voltages $V_{CFLY,AB}$ and $V_{CFLY,CD}$, which show a standard charge and discharge capacitor behaviour. During phase ϕ1, the flying capacitor $C_{FLY,AB}$ is connected between VMID and VTOP, meaning that it is discharging to the load and its current is linearly decreasing. The same is for $C_{FLY,CD}$ during phase ϕ2. During phase ϕ1, the flying capacitor $C_{FLY,CD}$ is connected between VMID and VBOT, meaning that it is charging from the DC input voltage source and its current is increasing. The same is for $C_{FLY,AB}$ during phase ϕ2.

Figure 8:
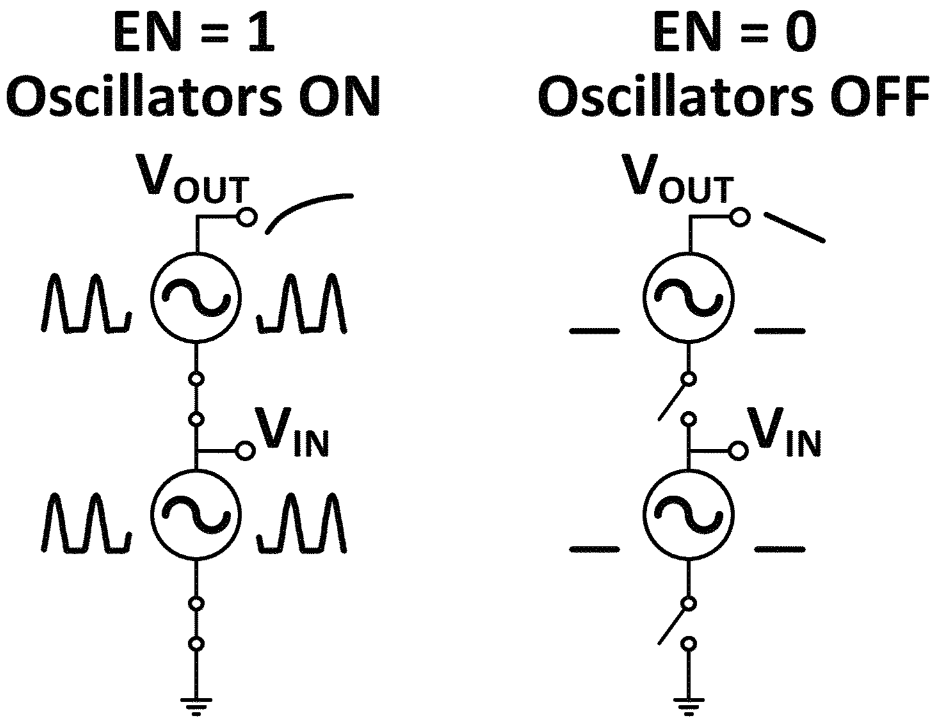
FIG. 8 shows the converter configurations when used as a voltage doubler with the footer transistor switched on and switched off.

FIG. 8 shows the circuit schematic when the footer enable signal is high, with logic value 1, and when it is low, with logic value 0. Each of the two vertically stacked oscillators, an example of whose single cell schematic is depicted in FIG. 5, is simply represented with the standard symbol of an oscillator. The footer transistor is simplified as an on/off ideal switch. When the footer enable signal is high, the converter operates as in full load, thus both oscillators are resonating, and power is delivered to the load.

During this time, called on-time of the converter, the output voltage increases. When the footer enable signal is low, both oscillators are switched off and no power is delivered to the load. During this time, called off-time of the converter, the output capacitor provides current to the resistive load and the output voltage decreases.

Figure 9:
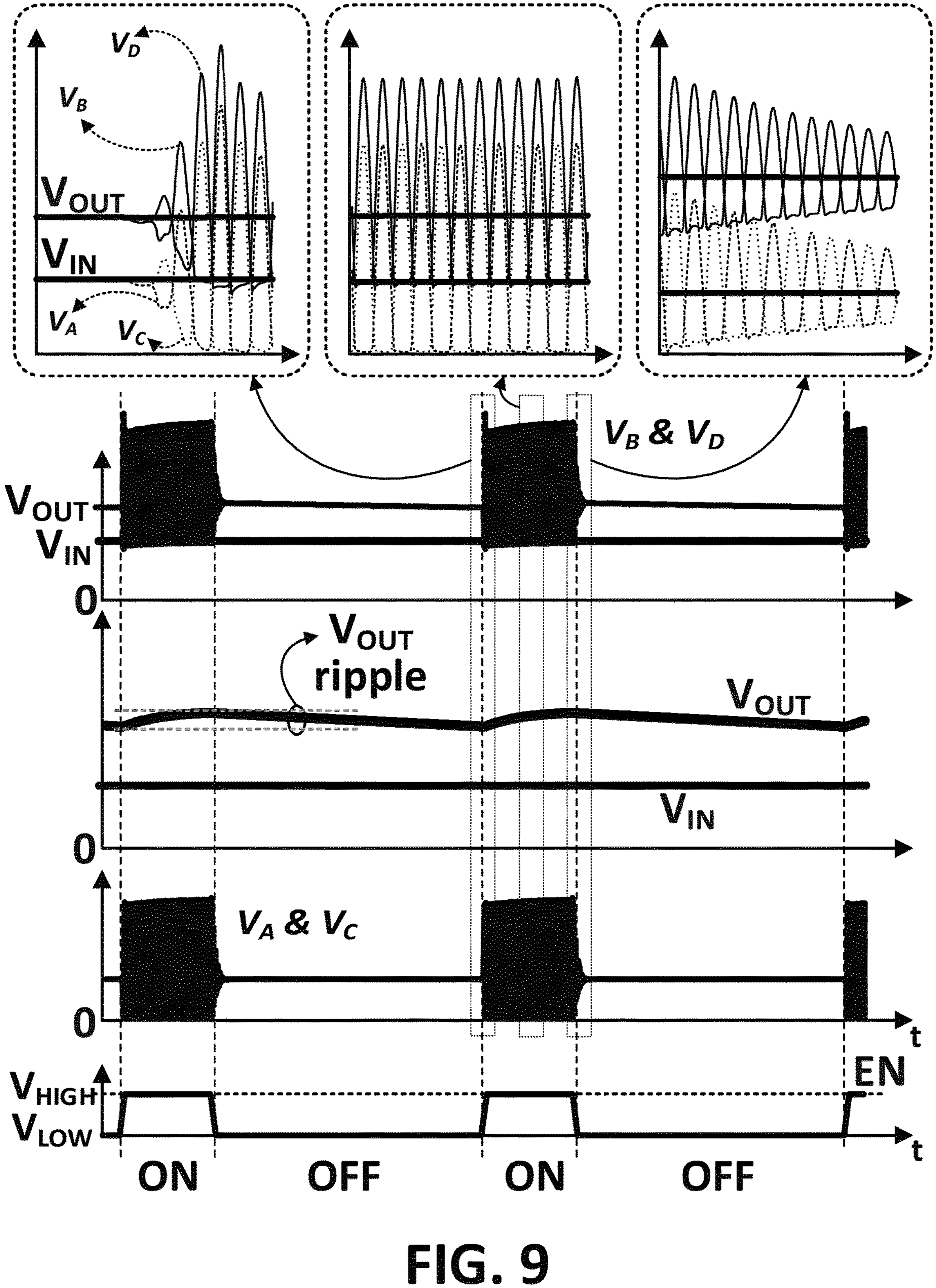
FIG. 9 depicts exemplary simulation results generated in a SPICE simulation for the converter in FIG. 4 when used as a voltage doubler, focusing on the duty cycled operation.

FIG. 9 shows the simulation of the converter depicted in FIG. 4 when the footer transistor is fed with a rectangular wave, named as EN and shows at the bottom of FIG. 9. The resonating voltages are oscillating during the on-time, providing power to the load and the output voltage VOUT is increasing. No power is delivered to the output during the off-time and the output voltage VOUT is decreasing. During this time, the output capacitor is providing power to the output resistive load, limiting the output voltage decrease.

A magnified drawing of the resonating voltages VA, VB, VC and VD is displayed on the top of FIG. 9. The one on the top-left shows the startup of the oscillators, in which the converter is transitioning from the OFF to the ON phase. The one in the middle shows the operation during the on-time, similar to that in full load where all the resonating voltages are oscillating. The one on the top-right shows the turn-off of the oscillators, where the resonating voltage amplitudes is decreasing approaching zero.

Figure 10:
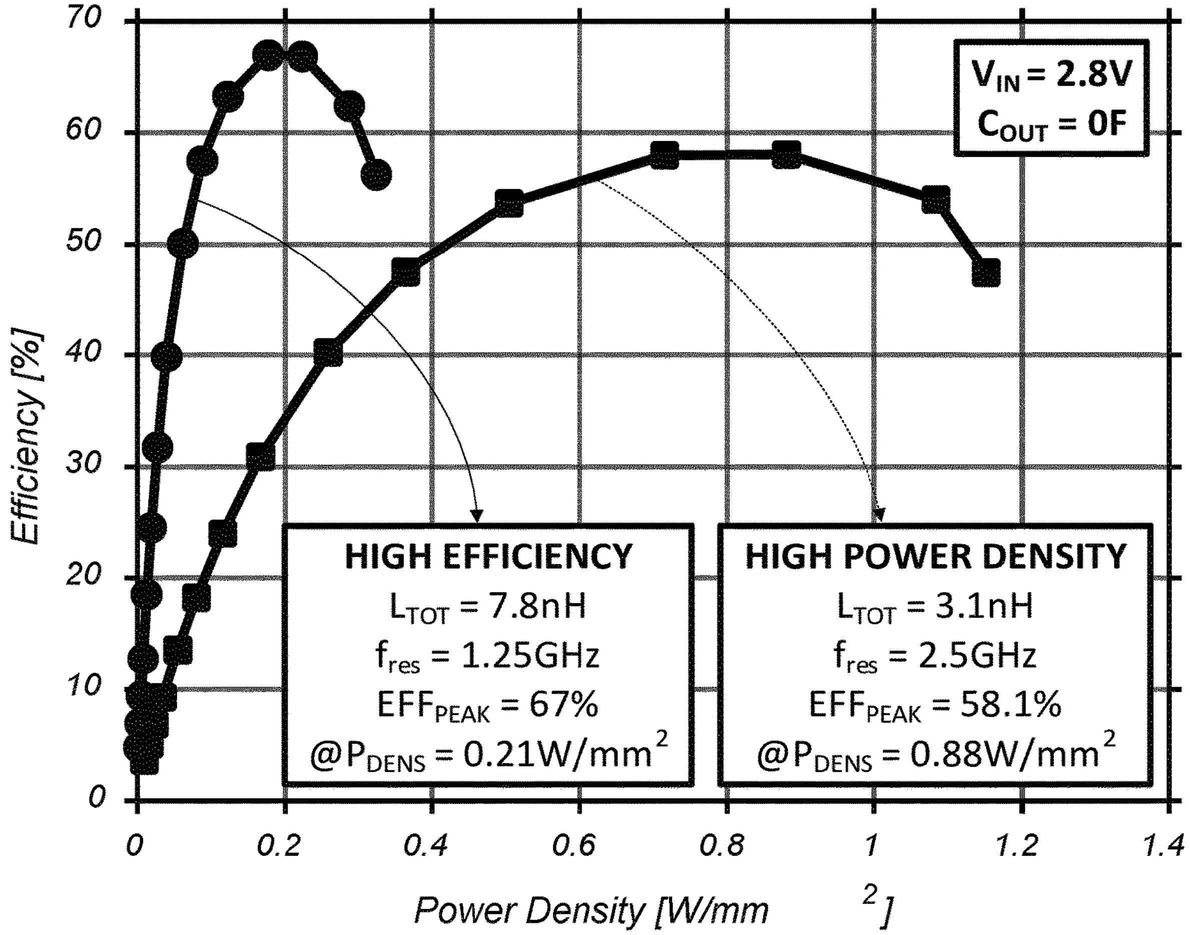
FIG. 10 depicts measurement results of the efficiency at fixed input voltage of the proposed converter when used as a voltage divider for two different transformer, capacitor and transistor sizing, for a high efficiency and a high power density version, respectively.

FIG. 10 shows the efficiency measurements result of the proposed converter when operated in down-conversion with a 2.8V input voltage and zero output capacitance. Two versions of the proposed converter have been measured, presenting different transformers, flying capacitors and transistors sizing, originating the High Efficiency and the High Power Density versions. The high efficiency version achieves a peak efficiency equal to 67% at a power density of 0.21 W/mm^2 resonating at 1.25 GHz. The high power density version achieves a peak efficiency equal to 58.1% at a power density of 0.88 W/mm^2 resonating at 2.5 GHz. The measurement result shows the tradeoff between higher efficiency of the high efficiency version implemented with larger transformers and flying capacitances, and higher power density of the high power density version implemented with smaller transformers and flying capacitors.

Figure 11:
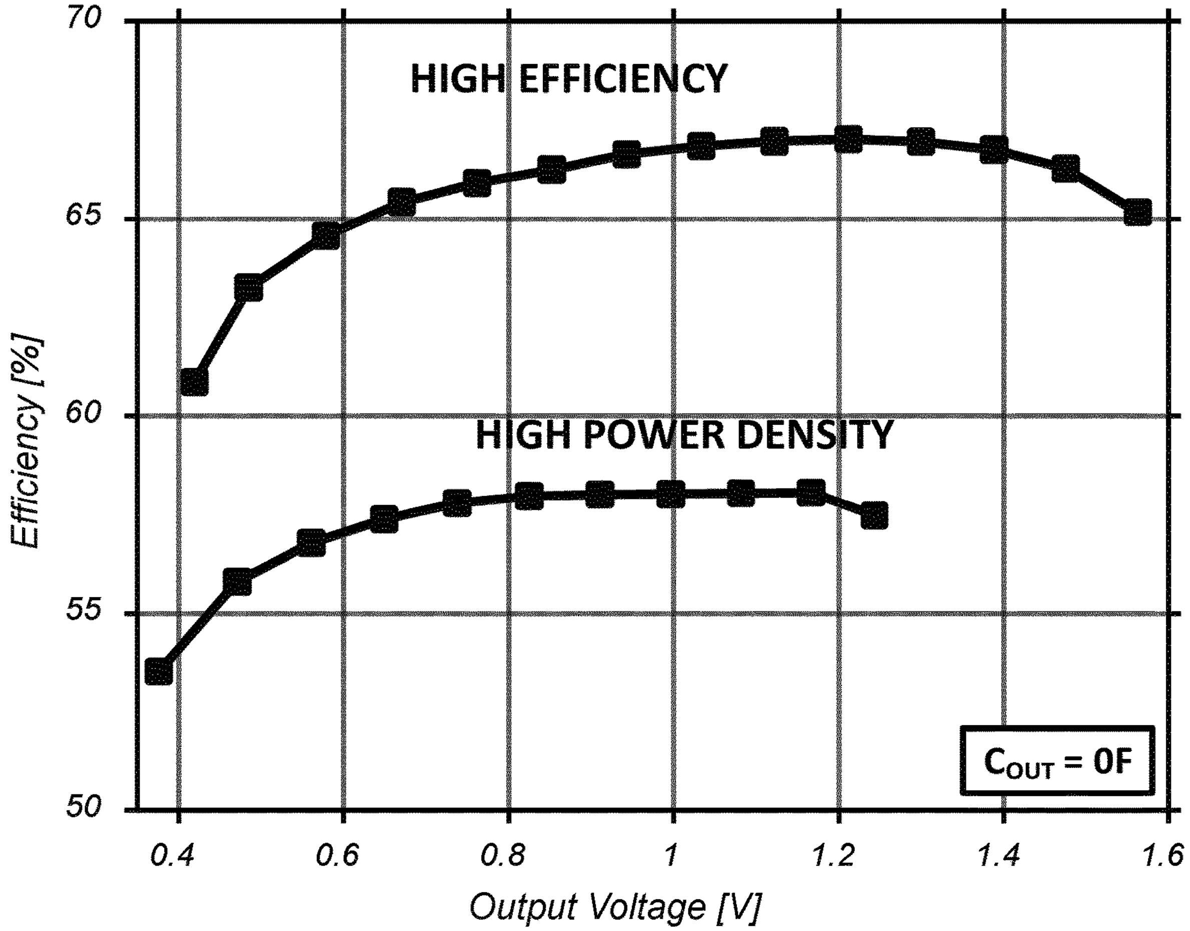
FIG. 11 depicts measurement results of the peak efficiency for different input voltages of the proposed converter when used as a voltage divider for two different transformer, capacitor and transistor sizing, for the high efficiency and high power density versions.

FIG. 11 shows the efficiency measurements result of the proposed converter when operated in down-conversion with input voltage ranging from 1V and 3.6V for the high efficiency version and 1V and 3V for the high power density version, and zero output capacitance. The measurement results show the wide range of input voltages that the proposed converter could operate with.

Figure 12:
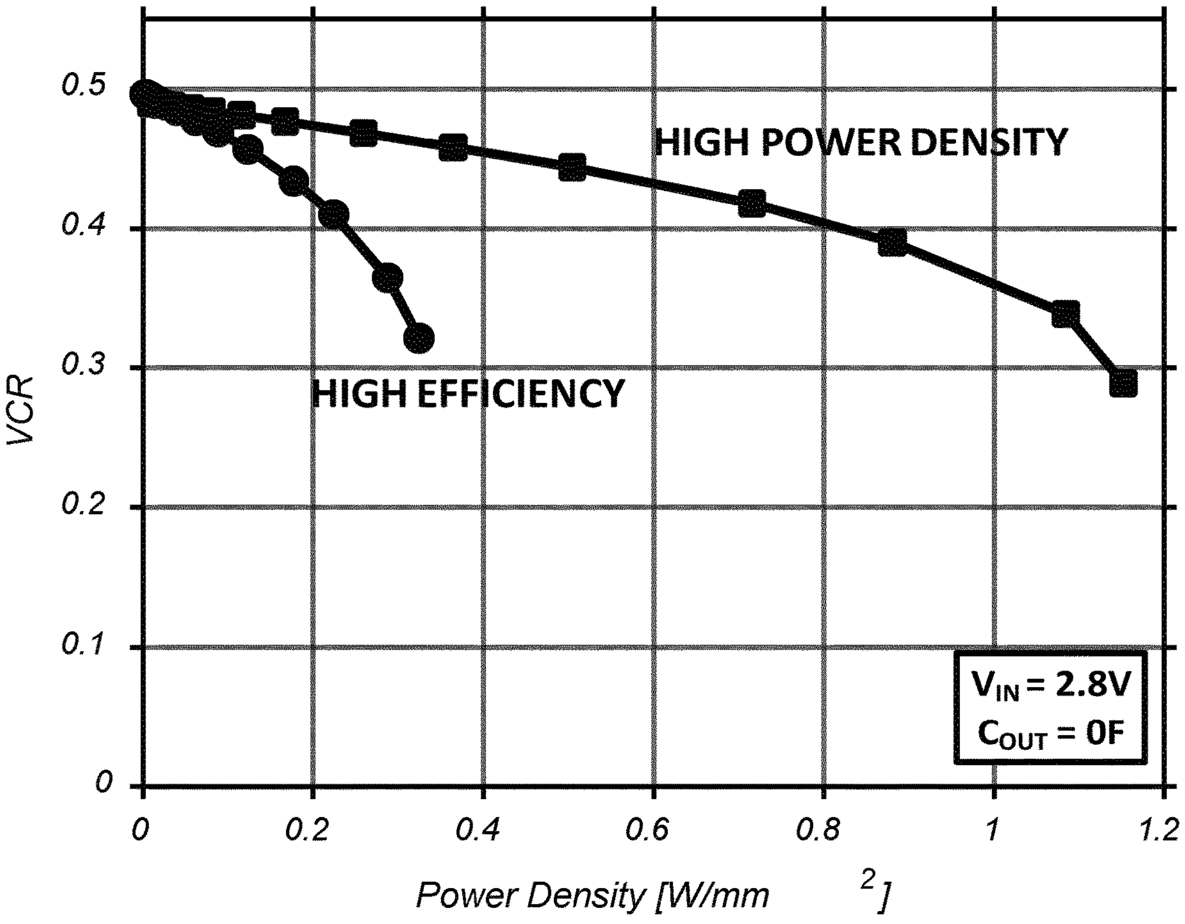
FIG. 12 depicts measurement results of the conversion ratio at fixed input voltage of the proposed converter when used as a voltage divider for two different transformer, capacitor and transistor sizing, for the high efficiency and high power density versions.

FIG. 12 shows the voltage conversion ratio measurements result of the proposed converter when operated in down-conversion with a 2.8V input voltage and zero output capacitance. The voltage conversion ratio (VCR) is defined as:

VCR=VOUT/VIN

The measurement results show the output voltage characteristics of the proposed converter over a varying load resistance when operating in full load without the use of the footer to regulate the output voltage.

Figure 13:
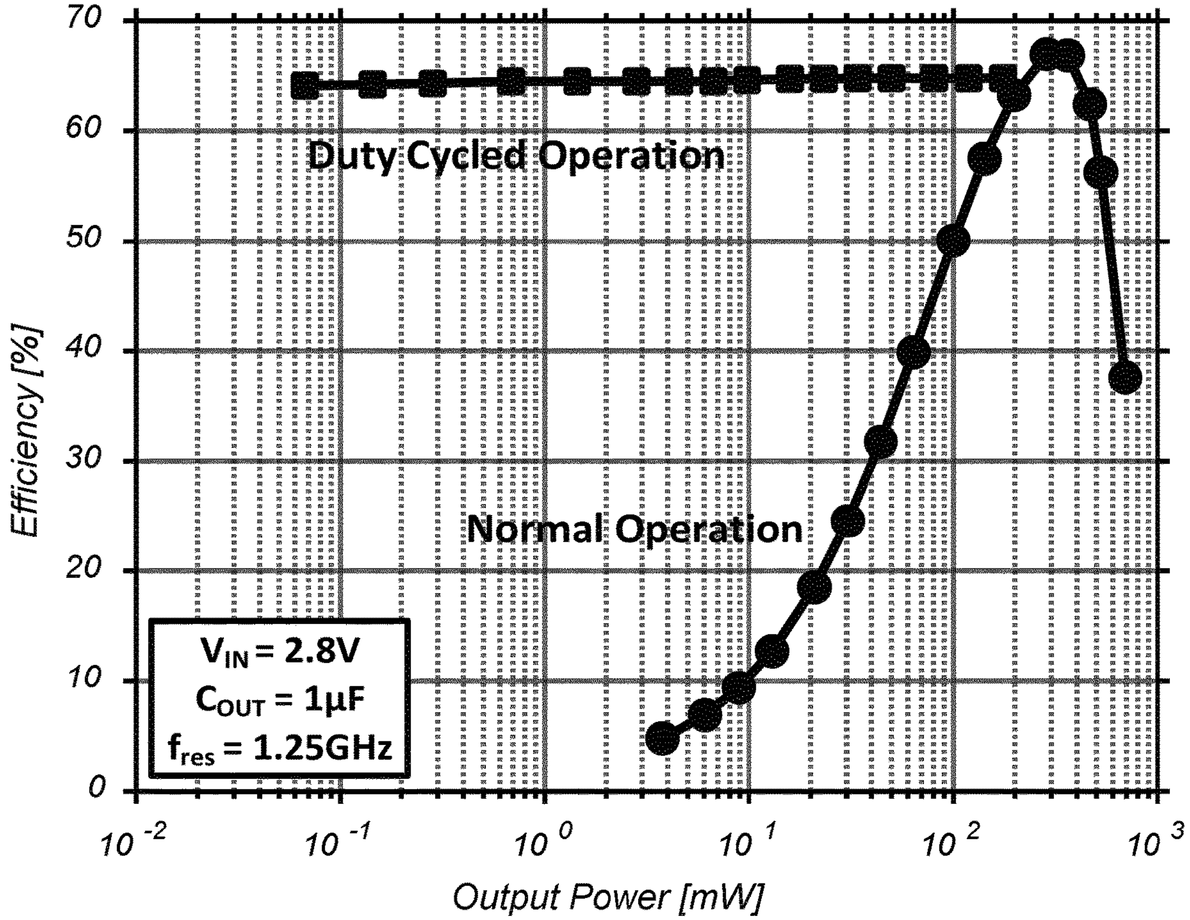
FIG. 13 depicts measurement results of the efficiency at fixed input voltage of the proposed converter when used as a voltage divider in the normal and duty cycled operations, for two different transformer, capacitor and transistor sizing, for the high efficiency and high power density versions.

FIG. 13 shows the efficiency measurements result of the proposed converter when operated in down-conversion with a 2.8V input voltage, comparing the full load operation with the duty cycled operation. The dark curve shows the full load operation, where the footer transistor is controlled with a constant DC voltage and acts as an always-on switch with low on-resistance. The grey curve shows the operation when the footer transistor is controlled with a square wave which duty cycles the converter. The measurement results show that the duty cycling scheme successfully improves the converter efficiency which remains close to the peak from 70 uW up to 0.5 W of output power.

Figure 14:
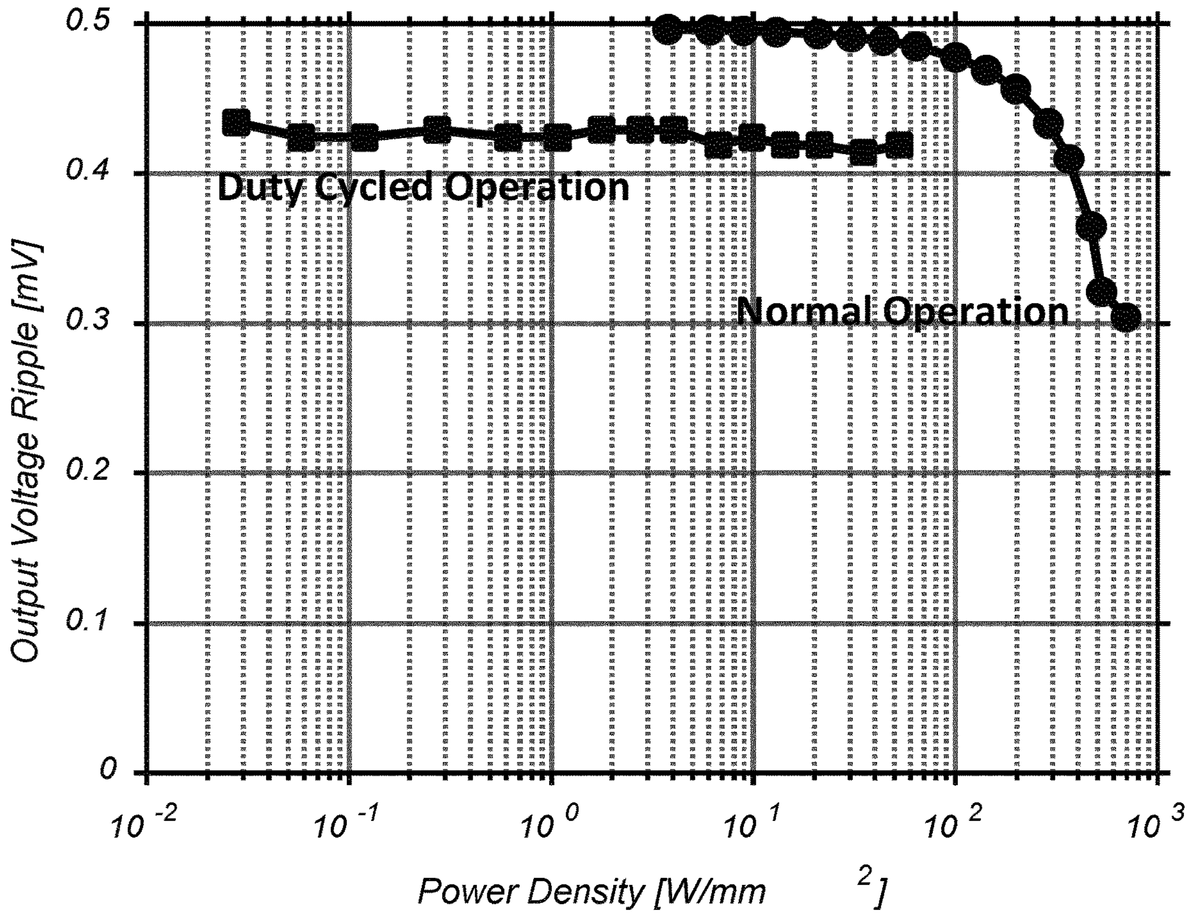
FIG. 14 depicts measurement results of the conversion ratio at fixed input voltage of the proposed converter when used as a voltage divider in the normal and duty cycled operations, for two different transformer, capacitor and transistor sizing, for the high efficiency and high power density versions.

FIG. 14 shows the voltage conversion ratio measurements result of the proposed converter when operated in down-conversion with a 2.8V input voltage, comparing the full load operation with the duty cycled operation. The dark curve shows the full load operation, where the footer transistor is controlled with a constant DC voltage and acts as a always-on switch with low on-resistance. The grey curve shows the operation when the footer transistor is controlled with a square wave which duty cycles the converter. The measurement results shows that the duty cycling scheme successfully regulates the output voltage to the desired value providing optimal efficiency.

Figure 15:
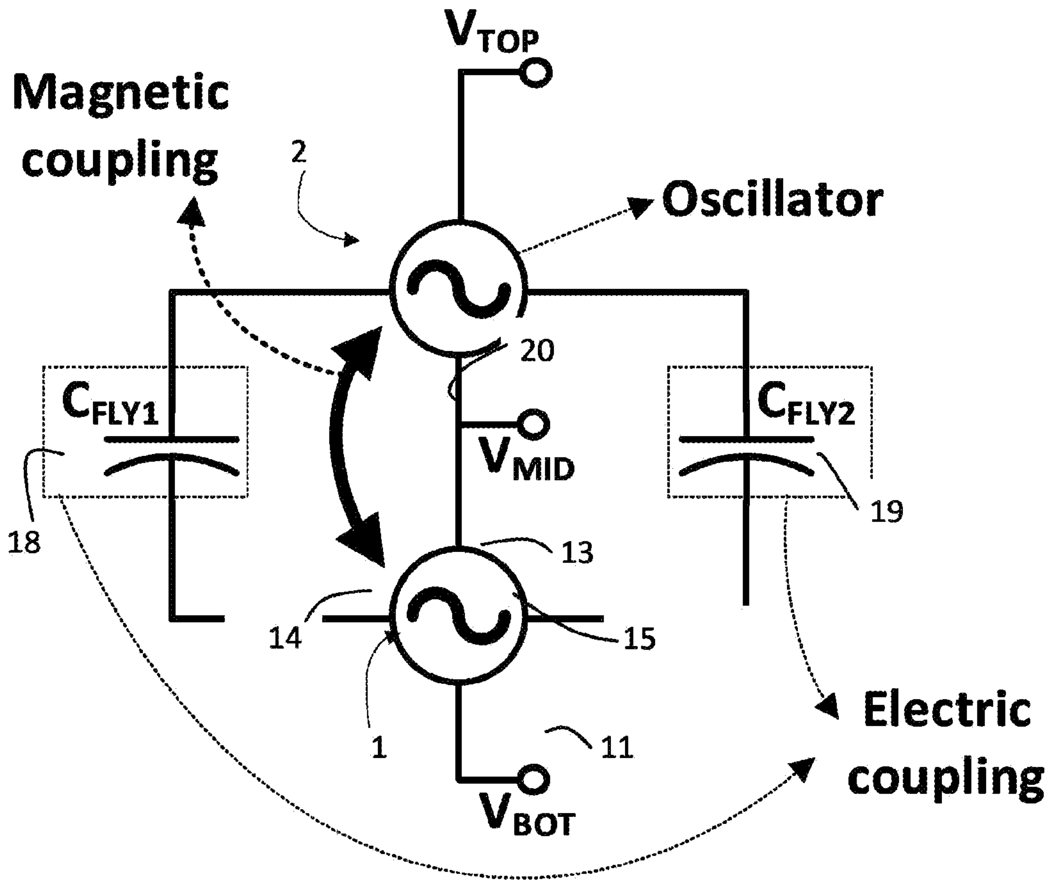
FIG. 15 shows a generalized structure of the converter.

FIG. 15 shows a generalized basic structure of a series or vertical arrangement of two oscillators, where at least two oscillators are electrically and/or magnetically coupled by means of capacitors and/or inductors respectively. Elements presented in the context of the more detailed structure of FIG. 4 are designated with the same reference numbers.

The at least two oscillators generally are of the same type. They can be of one or more of the following types: Class-D LC oscillator (as in the preceding figures), Class-B LC oscillator, Class-C LC oscillator, Class-E LC oscillator, Class-F LC oscillator, Hartley LC oscillator, Cross-Coupled oscillator, Ring oscillator, Delay-line oscillator, Wien Bridge oscillator, RC Phase Shift oscillator, Hartley oscillator, Voltage Controlled oscillator, Colpitts oscillator, Clapp oscillator, Crystal oscillator, Armstrong oscillator, Meissner oscillator, Tuned Collector oscillator, Pierce oscillator, Robinson oscillator, Royer oscillator, Tuned Collector oscillator, Pierce oscillator, Robinson oscillator, Royer oscillator.

Some of the oscillators listed above have only one oscillating terminal, and the flying capacitors are organized accordingly: for instance, if only one node is available, according to one embodiment, only one flying capacitor is be used. According to other embodiments, the oscillator output is converted from being single-ended to double-ended, replacing one output terminal by two output terminals, and the coupling elements are connected to these two output terminals.

Figure 16:
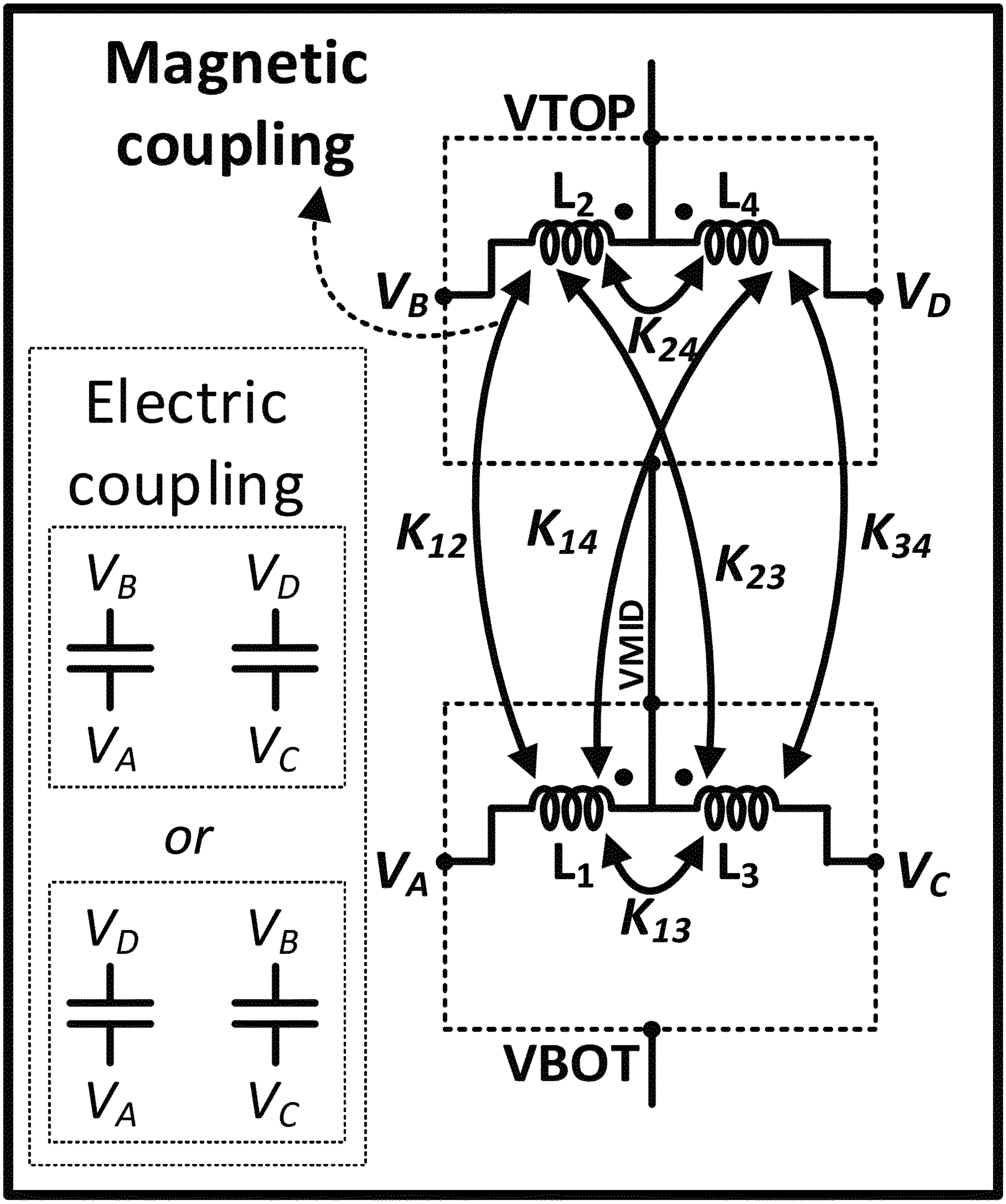
FIG. 16 shows all the magnetic couplings possible between the four inductors that are part of the two coupled oscillator cells.

FIG. 16 shows all the magnetic coupling possible between the four inductors that are part of the two coupled oscillator cells. All the magnetic coupling coefficients below can be positive or negative. It also shows the two ways in which horizontal coupling could be arranged vertically. For more than two oscillator cells, the coupling can be extended accordingly.

Figure 17:
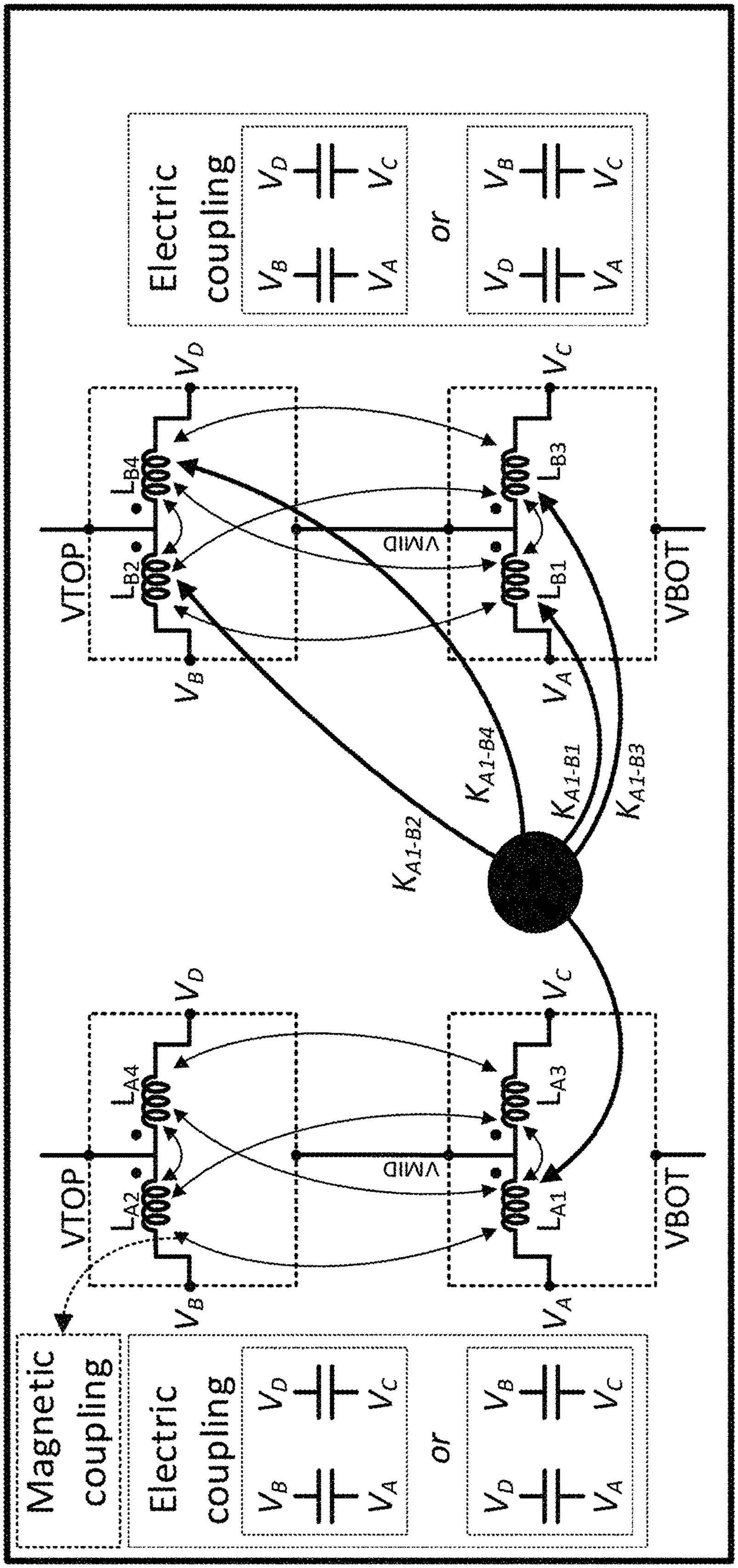
FIG. 17 shows that both horizontal and vertical couplings are possible separately and also implemented both together.

FIG. 17 shows that both horizontal and vertical couplings are possible separately and also implemented both together.

Figure 18:
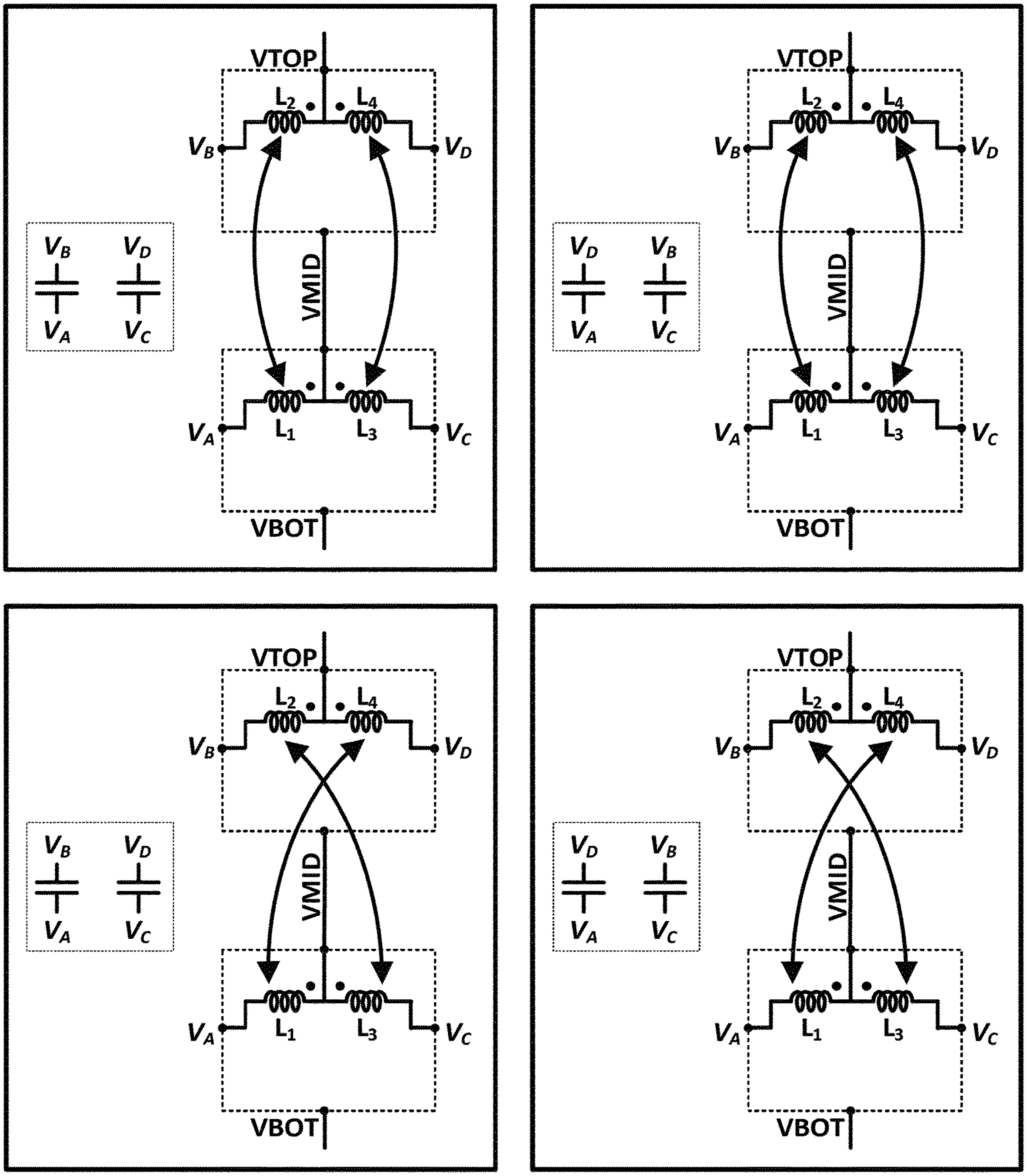
FIG. 18 shows some configurations in which vertical magnetic and electric coupling are combined.

FIG. 18 shows some configurations in which vertical magnetic and electric coupling are combined. This does not show all the possible combinations but some important ones. All the coupling coefficients shown in FIG. 16 can be added and combined to for all the possible ways in which the coupling magnetic and electric coupling could involve all the capacitors and inductors in the structure.

Figure 19:
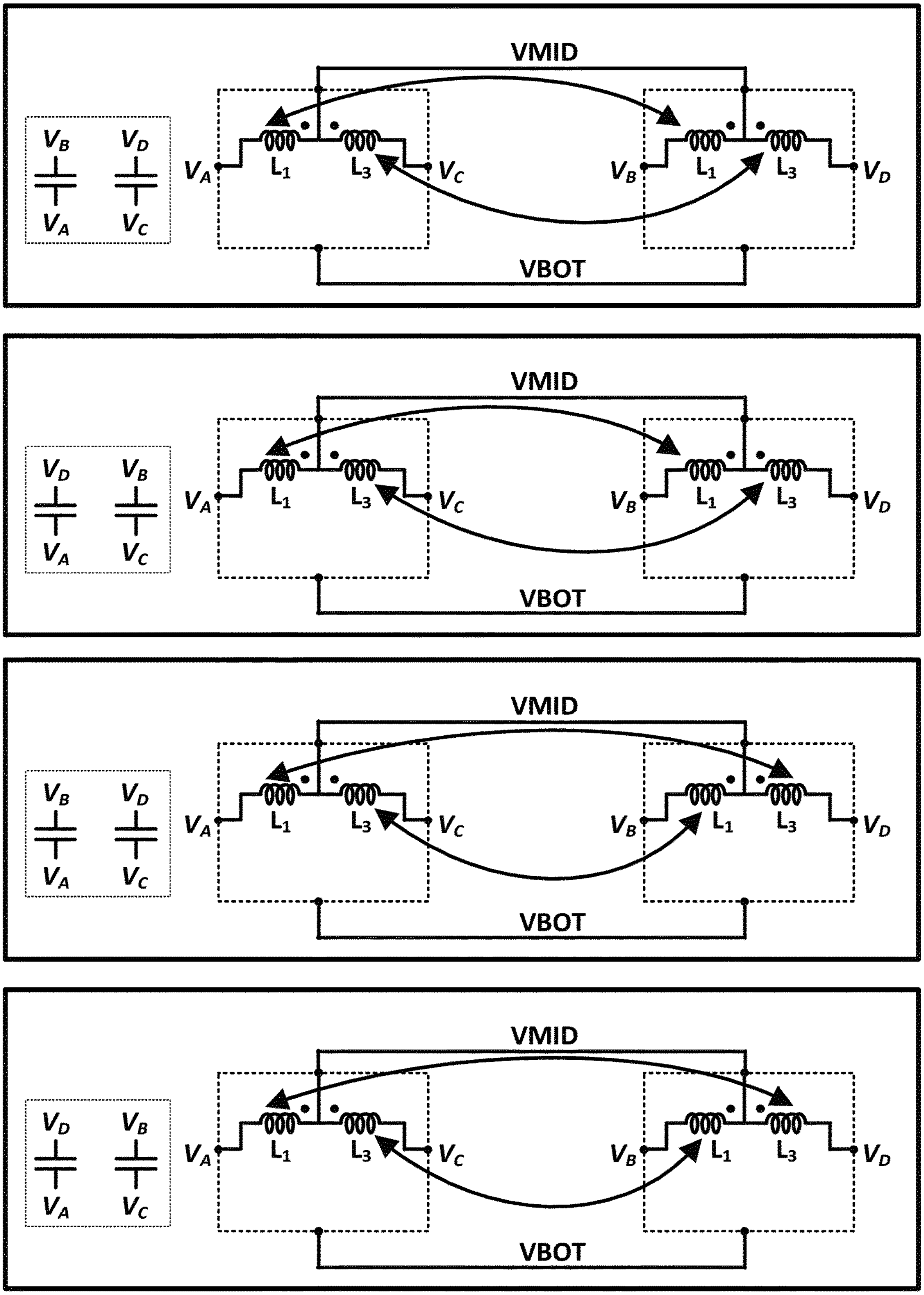
FIG. 19 shows some configurations in which horizontal magnetic and electric coupling are combined.

FIG. 19 shows some configurations in which horizontal magnetic and electric coupling are combined. This does not show all the possible combinations but some important ones. All the coupling coefficients shown in FIG. 16 can be added and combined to for all the possible ways in which the coupling magnetic and electric coupling could involve all the capacitors and inductors in the structure. Each of the configurations shown in FIG. 19 can correspond to the internal structure of the oscillators shown in FIG. 15. For example, if one of the configurations implements the bottom oscillator 1 of FIG. 15, the VMID terminal could be the input or output and the VBOT terminal would be the reference. If it implements the top oscillator 2 of FIG. 15, the VMID terminal could be the input or output and the VBOT terminal would be output or input, respectively.

Figure 20:
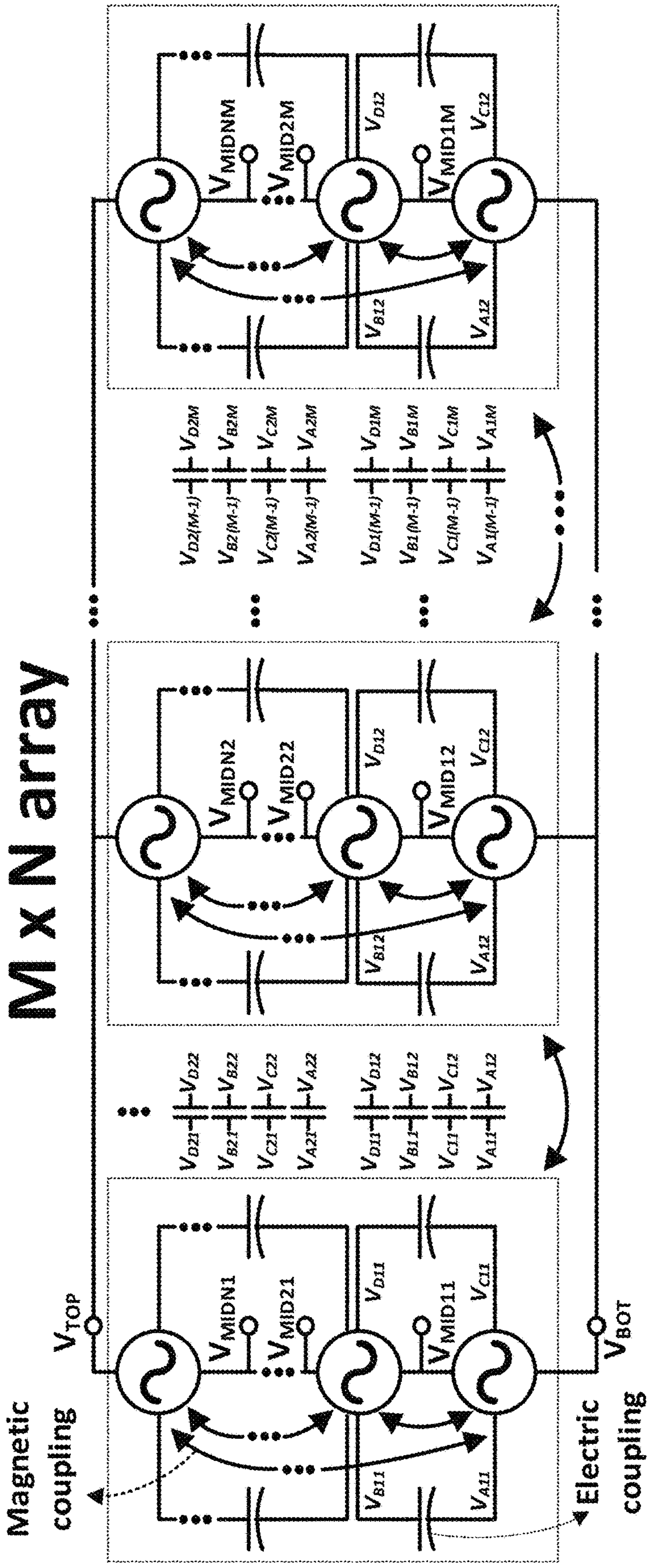
FIG. 20 shows an M×N array structure with a generic oscillator as a basic cell. In principle, identical or functionally identical parts are provided with the same reference symbols in the figures.

FIG. 20 shows an M×N array structure with a generic oscillator as basic cell. Each oscillator can be coupled with any of the other oscillators in the array by means of capacitors and/or inductors. The coupling could be vertical and/or horizontal, where any of the single cell oscillating node could be electrically coupled any of the oscillating nodes of the other cell using capacitors, and/or one of the inductors of the single cell could be magnetically coupled with any of the inductors in the other cell.

The value of a single inductance in any of the coupled oscillators can be different from each other, for generating different voltages across each oscillator. The capability of generating different voltages translates into different DC-DC converter voltage conversion ratios, expressed as VCR=VOUT/VIN, which will make the proposed topology more flexible to a wide variety of applications where there are specific demands on the voltage conversion ratio required.

Figure 21:
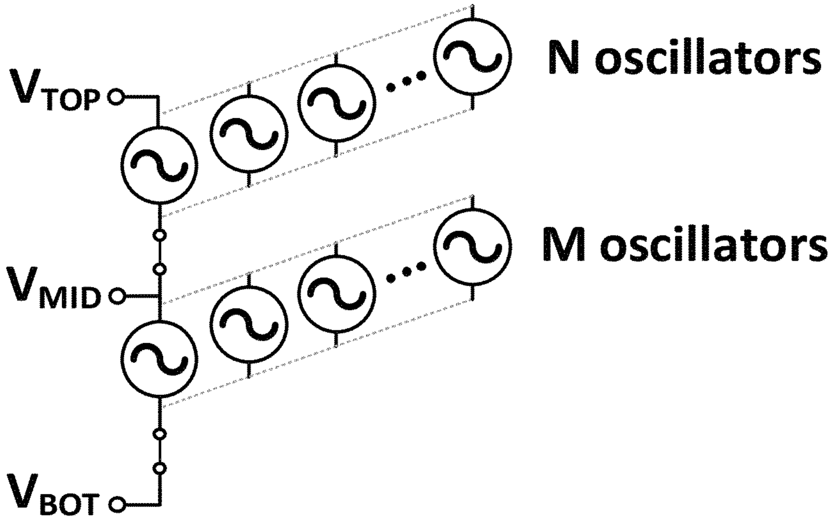
FIG. 21 shows a single oscillator unit comprising parallel oscillating units.

FIG. 21 shows, referring to the array presented in FIG. 20, how each single oscillator unit can comprise one or more parallel oscillating units. FIG. 21 shows the example for a minimum size array of 2 rows and 1 column, where the bottom unit comprises M parallel oscillators and the top unit by N parallel oscillators, where M and N can be any integer number. The capability of designing a single unit as combination of multiple parallel units results in different voltages generated across each oscillator, providing more flexibility to design the proposed converter featuring several voltage conversion ratios to fit a wide variety of applications.

Figure 22:
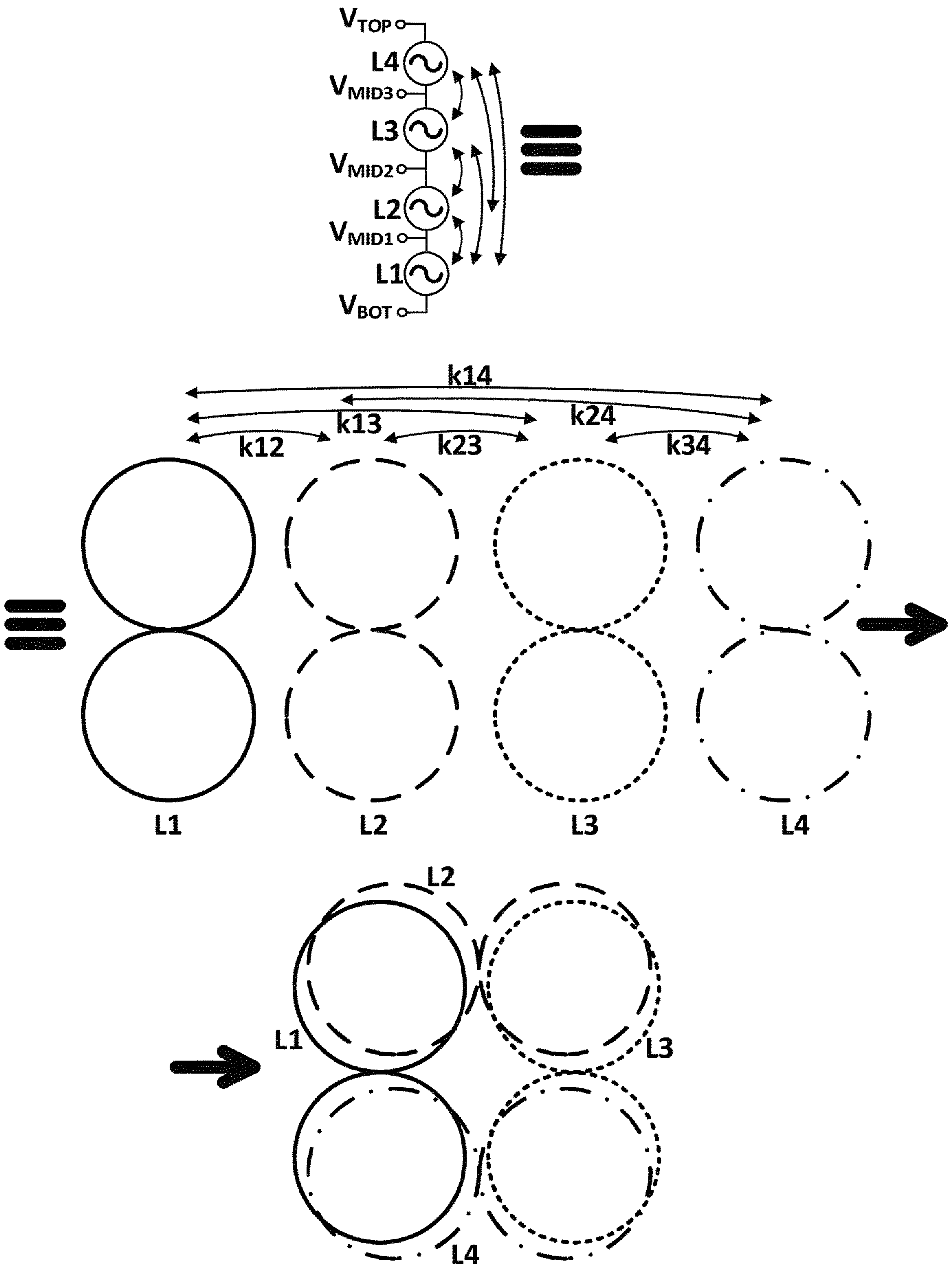
FIG. 22 shows a structure of inductors for magnetic coupling between oscillator units.

FIG. 22 shows, referring to the array presented in FIG. 20, and for the case of a 4×1 array with 4 rows and 1 column, a structure of inductors. This structure can be beneficial to maximize the magnetic coupling between the single oscillator units of the array, namely k12, k13, k14, k23, k24, k34 in the example, to maximize the converter efficiency. Therefore, if one of the inductors belonging to a single oscillator unit (L1-L4 in the 4 depicted oscillators) needs to be coupled with any of the inductors in the other units (L1-L4), in the example of building them with an 8-shaped structure, they can be arranged as depicted in FIG. 22. Therein, each inductor comprises two loops arranged in an 8-shape in a planar configuration. One loop of each inductor is arranged to be magnetically coupled with one loop of a corresponding adjacent inductor. Each inductor is coupled, by its two loops, to two respective adjacent inductors. The inductors are in a sequence, with a loop of a first inductor of the sequence being coupled to a loop of a last inductor of the sequence, thereby forming a circular arrangement. The arrangement provides a high coupling between all the inductors.

The inductance value of an inductor can be between 10 pH and 100 nH, in particular between 100 pH and 50 nH, in particular between 500 pH and 20 nH.

The loops can be coupled by adjacent placing, involving either interleaving, stacking or both, of the involved inductors. Interleaving means that conductors of the loop lie mostly in the same plane, crossing one another at, for example, two locations. Stacking means that the conductors of the loop are at least approximately congruent and lie in parallel planes. In each case (interleaving or stacking) and also for other arrangements of coupled inductors in a fully integrated converter, manufactured as an integrated circuit, the conductors can be realized as conducting layers within the integrated circuit. In each case (interleaving or stacking), and also for other arrangements of coupled inductors, the conductors can be realized as conducting layers on a printed circuit board (PCB).

Figure 23:
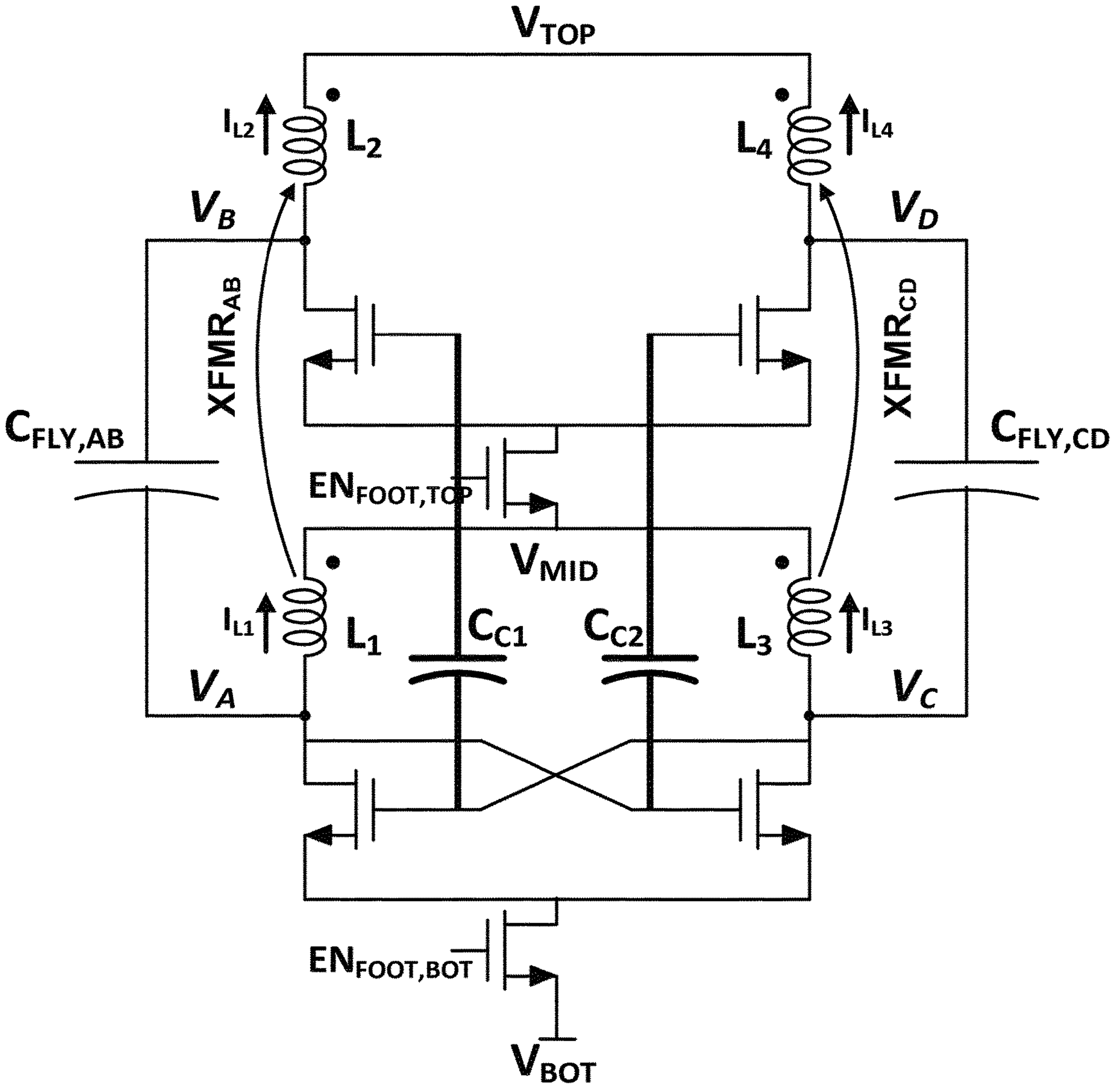
FIG. 23 shows one oscillator generating oscillations and driving another one.

FIG. 23 shows an embodiment in which only one oscillator is to be cross-connected and is responsible to generate and maintain the oscillations. Thereby, the other electrically, magnetically or electromagnetically coupled oscillators can avoid the cross-connection and are simply coupled through the gate of the transistors with an appropriate coupling capacitance. This will offer more design flexibility of the voltages provided to the other electrically, magnetically or electromagnetically coupled oscillators transistor gates through the sizing of the additional coupling capacitors CC1 and CC2. This can reduce or minimize the transistor resistive losses and respect their device maximum ratings. The structure of FIG. 23 shows such a structure, based on the example of the class-D oscillator but which could also be any other type as explained above in relation to FIG. 15.

Application fields for the converter presented herein are, for example: Power management and energy harvesting circuits (for DC/DC, AC/DC, DC/AC and AC/AC-converter), Low-dropout regulators, Voltage Regulators, Power Amplifiers, LED drivers, Flash drivers, Charge-pump circuits, Mm-Wave Wireless communication circuits, Radars, Image sensors, Time-of-flight sensors, Circuits for machine learning and artificial intelligence, Analog-to-digital converters, Transceivers, Optical communication circuits, Memories, Frequency synthesizers, Phase locked loop, Delay locked loop, Voltage controlled oscillators, CRYO-CMOS for quantum technologies, Circuits for internet of things, Biomedical circuits, Processors, Clock circuits, Circuits for security, Circuits for RF and emerging THz techniques.

The invention claimed is:

1. An electrical converter, comprising at least two oscillators, each of the at least two oscillators being designed to have an oscillating current and an oscillating voltage;

one or more coupling elements arranged to couple at least one of the oscillating currents of the at least two oscillators, and the oscillating voltages of the at least two oscillators;

the at least two oscillators being connected in a series connection, adding their oscillating voltages, wherein it either is the case that the converter is controlled to operate with a voltage across one of the at least two oscillators being an input DC voltage to the converter and a voltage across all of the at least two oscillators being a DC output of the converter;

or it is the case that the converter is controlled to operate with a voltage across all of the at least two oscillators being an input DC voltage to the converter and a voltage across one of the at least two oscillators being a DC output of the converter.

2. The electrical converter of claim 1, with one of the at least two oscillators, from now on called top oscillator, having an associated top terminal and a bottom terminal, and another one of the at least two oscillators, from now on called bottom oscillator, having an associated top terminal and a bottom terminal, with the top terminal of the bottom oscillator being connected to the bottom terminal of the top oscillator, wherein it either is the case that the converter is controlled to up-convert an input DC voltage, by the top terminal of the bottom oscillator being connected to a terminal for supplying to the converter an input DC voltage relative to the bottom terminal of the bottom oscillator, and the top terminal of the top oscillator being connected to a DC output terminal for an output voltage relative to the bottom terminal of the bottom oscillator;

or wherein it is the case that the converter is controlled to down-convert an input DC voltage, by the top terminal of the top oscillator being connected to a terminal for supplying to the converter an input DC voltage relative to the bottom terminal of the bottom oscillator, and the top terminal of the bottom oscillator being connected to a DC output terminal for an output voltage relative to the bottom terminal of the bottom oscillator.

3. The electrical converter of claim 1 wherein the one or more coupling elements comprise inductive coupling elements, coupling oscillating currents of the at least two oscillators, in particular wherein one or more of the inductive coupling elements are transformers.

4. The electrical converter of claim 1, wherein the one or more coupling elements comprise capacitive coupling elements, coupling oscillating voltages of the at least two oscillators, in particular wherein one or more of the capacitive coupling elements are capacitors.

5. The electrical converter of claim 1, wherein the at least two oscillators are self-oscillating oscillators.

6. The electrical converter of claim 1, wherein at least one of the at least two oscillators is not a self-oscillating oscillator.

7. The electrical converter of claim 1, wherein the self-oscillating oscillator or oscillators are LC oscillators.

8. The electrical converter of claim 1, wherein the self-oscillating oscillator or oscillators are one of Class-D LC oscillators, Class-B LC oscillators, Class-C LC oscillators, Class-E LC oscillators, Class-F LC oscillators, Hartley LC oscillators.

9. The electrical converter of claim 1, in which at least one, more than one, or all coupling elements are integrally manufactured with switches of the at least two oscillators.

10. The electrical converter of claim 1, configured for an oscillation frequency of the at least one oscillator to be at least 500 MHz, preferably at least 1 GHz.

11. The electrical converter of claim 1, configured for continuous operation transferring power at a maximum rate of least 1 mW, in particular at least 10 mW, in particular at least 1 W.

12. The electrical converter of claim 1, manufactured in a fully integrated fashion and configured to operate at a power density of least 0.1 W/mm$^2$, in particular at least 0.2 W/mm$^2$, in particular at least 0.5 W/mm$^2$, in particular at least 2.5 W/mm$^2$.

13. The electrical converter of claim 1, wherein the coupling elements are arranged to move charges moved away from parasitic gate capacitances.

14. The electrical converter of claim 1, wherein one or more of the at least two oscillators are configured to be switched on and off, enabling and disabling oscillation of the oscillator, respectively.

15. The electrical converter of claim 14, being controlled to periodically enable and disable oscillation of one or more or all of the at least two oscillators in order to adapt operation of the converter to load changes.

16. The electrical converter of claim 1, wherein one or more of the at least two oscillators are configured to be switched on and off, enabling and disabling oscillation of the oscillator, respectively.

17. The electrical converter of claim 16, being controlled to periodically enable and disable oscillation of one or more or all of the at least two oscillators in order to adapt operation of the converter to load changes.

18. Method for operating an electrical converter, the electrical converter comprising at least two oscillators, each of the at least two oscillators being designed to have an oscillating current and an oscillating voltage;

one or more coupling elements arranged to couple at least one of the oscillating currents of the at least two oscillators, and the oscillating voltages of the at least two oscillators;

the at least two oscillators being connected in a series connection, adding their oscillating voltages, or in a parallel connection, adding their oscillating currents, or in a combination of series and parallel connections, the method comprising the steps of periodically enabling and disabling oscillation of one or more or all of the at least two oscillators in order to adapt operation of the converter to load changes.

19. Method for operating an electrical converter, the electrical converter comprising at least two oscillators, each of the at least two oscillators being designed to have an oscillating current and an oscillating voltage;

one or more coupling elements arranged to couple at least one of the oscillating currents of the at least two oscillators, and the oscillating voltages of the at least two oscillators;

the at least two oscillators being connected in a series connection, adding their oscillating voltages, or in a parallel connection, adding their oscillating currents, or in a combination of series and parallel connections, with one of the at least two oscillators, from now on called top oscillator, having an associated top terminal and a bottom terminal, and another one of the at least two oscillators, from now on called bottom oscillator, having an associated top terminal and a bottom terminal, with the top terminal of the bottom oscillator being connected to the bottom terminal of the top oscillator, the method comprising either the step of operating the converter to up-convert an input DC voltage, by the top terminal of the bottom oscillator being connected to a terminal supplying an input DC voltage relative to the bottom terminal of the bottom oscillator, and the top terminal of the top oscillator being connected to a DC output terminal providing an output voltage relative to the bottom terminal of the bottom oscillator;

or the method comprising the step of operating the converter to down-convert an input DC voltage, by the top terminal of the top oscillator being connected to a terminal supplying an input DC voltage relative to the bottom terminal of the bottom oscillator, and the top terminal of the bottom oscillator being connected to a DC output terminal providing an output voltage relative to the bottom terminal of the bottom oscillator.

* * * * *